(12) United States Patent
Chen

(10) Patent No.: US 12,079,252 B2
(45) Date of Patent: Sep. 3, 2024

(54) MODELING ANALYSIS METHOD FOR DEVICE MANAGEMENT NETWORK AND ELECTRONIC DEVICE

(71) Applicant: Longyu Chen, Xi'an (CN)

(72) Inventor: Longyu Chen, Xi'an (CN)

( * ) Notice: Subject to any disclaimer, the term of this patent is extended or adjusted under 35 U.S.C. 154(b) by 551 days.

(21) Appl. No.: 17/340,724

(22) Filed: Jun. 7, 2021

(65) Prior Publication Data
US 2021/0294826 A1 Sep. 23, 2021

Related U.S. Application Data

(63) Continuation-in-part of application No. 16/885,240, filed on May 27, 2020, now Pat. No. 11,049,195, (Continued)

(30) Foreign Application Priority Data

Feb. 9, 2018 (CN) .......................... 201810131136.4
Feb. 8, 2021 (CN) .......................... 202110174547.3

(51) Int. Cl.
*G06F 16/29* (2019.01)
*G01R 31/08* (2020.01)
(Continued)

(52) U.S. Cl.
CPC ........... *G06F 16/29* (2019.01); *G01R 31/088* (2013.01); *G06Q 50/06* (2013.01); *G06T 11/203* (2013.01); *H02J 3/0012* (2020.01)

(58) Field of Classification Search
CPC ...... G06Q 50/06; G06F 16/29; G09B 29/007; H04L 51/04; H04L 51/20; H04L 41/145;
(Continued)

(56) References Cited

U.S. PATENT DOCUMENTS 8,847,949 B1 9/2014 Strauss et al.
9,841,456 B2 12/2017 Basu et al.
(Continued)

FOREIGN PATENT DOCUMENTS

CN 101561897 A 10/2009
CN 101685471 A 3/2010
(Continued)

OTHER PUBLICATIONS

NPL1 (Martin LaMonica, Inside a power grid control room (photos), CNET, retrieved from https://www.cnet.com/pictures/inside-a-power-grid-control-room-photos/, published Aug. 4, 2010, retrieved on Jan. 29, 2024) (Year: 2017).*
(Continued)

*Primary Examiner* — Michael A Keller
(74) *Attorney, Agent, or Firm* — Westbridge IP LLC

(57) ABSTRACT

The present application provides a modeling analysis method for a device management network and an electronic device. The modeling analysis method includes: acquiring position information and type information of a first node acquired by a user terminal; and displaying the first node on an electronic map according to the position information and type information of the first node, and establishing, in accordance with a first predetermined rule and on the electronic map, a line connection between the first node and at least one second node displayed on the electronic map. By the technical solution of the present application, a network model can be automatically constructed for rapid analysis, so that users can check the network diagram and network analysis results in real time, quickly, and automatically, so as to improve the real network of the physical world based on the rapid analysis of the network model.

11 Claims, 16 Drawing Sheets

Related U.S. Application Data which is a continuation of application No. PCT/CN2018/125393, filed on Dec. 29, 2018.

(51) Int. Cl.
*G06Q 50/06* (2012.01)
*G06T 11/20* (2006.01)
*H02J 3/00* (2006.01)

(58) Field of Classification Search
CPC ......... H04L 41/22; H04L 41/12; H04L 41/14; H04L 43/045
See application file for complete search history.

(56) References Cited

U.S. PATENT DOCUMENTS

| | | | |
|---|---|---|---|
| 2011/0172841 A1* | 7/2011 | Forbes, Jr. ............. | G06Q 10/10 700/297 |
| 2014/0310633 A1 | 10/2014 | McLellan et al. | |
| 2017/0092055 A1* | 3/2017 | Brockman ........... | G06V 20/176 |
| 2019/0067939 A1 | 2/2019 | Sheng et al. | |

FOREIGN PATENT DOCUMENTS

| | | |
|---|---|---|
| CN | 101763605 A | 6/2010 |
| CN | 102306338 A | 1/2012 |
| CN | 102375879 A | 3/2012 |
| CN | 102436678 A | 5/2012 |
| CN | 103456136 A | 12/2013 |
| CN | 103617295 A | 3/2014 |
| CN | 104616207 A | 5/2015 |
| CN | 108199907 A | 6/2018 |
| CN | 108582068 A | 9/2018 |
| CN | 110471979 A | 11/2019 |
| CN | 110674588 A | 1/2020 |
| EP | 3190528 A2 | 7/2017 |
| IN | 202021055433 A | 1/2021 |

OTHER PUBLICATIONS

Examination Report issued in counterpart Indian Patent Application No. 202017038623, dated Dec. 1, 2021.
Extended European Search Report issued in counterpart European Patent Application No. 18905609.6, dated Oct. 4, 2021.
First Office Action issued in counterpart Chinese Patent Application No. 201810131136.4, dated Sep. 28, 2018.
First Office Action issued in counterpart Chinese Patent Application No. 202110174547.3, dated Sep. 8, 2021.
Li et al., Reliability Analysis of Smart Grid Communication Network Baesd on Complex Network Theory, Journal of North China Electric Power University, vol. 45, No. 6, pp. 59-67, dated Nov. 30, 2018.
Notification to Grant Patent Right for Invention issued in counterpart Chinese Patent Application No. 201810131136.4, dated Jun. 4, 2019.
Notification to Grant Patent Right for Invention issued in counterpart Chinese Patent Application No. 202110174547.3, dated Dec. 17, 2021.
Third Office Action issued in counterpart Chinese Patent Application No. 201810131136.4, dated Jan. 29, 2019.
Written Opinion issued in corresponding PCT Application No. PCT/CN2018/125393, dated Mar. 13, 2019.

* cited by examiner

MODELING ANALYSIS METHOD FOR DEVICE MANAGEMENT NETWORK AND ELECTRONIC DEVICE

CROSS REFERENCE TO RELATED APPLICATIONS

This application is a continuation-in-part of U.S. patent application Ser. No. 16/885,240, filed on May 27, 2020, which is a continuation application of PCT/CN2018/125393, filed on Dec. 29, 2018, which claims priority to Chinese Patent Application No. 201810131136.4 filed on Feb. 9, 2018. This application also claims priority to Chinese Patent Application No. 202110174547.3, filed on Feb. 8, 2021. All of the aforementioned patent applications are hereby incorporated by reference in their entireties.

TECHNICAL FIELD

The present application relates to the field of information technology, and in particular to a modeling analysis method for a device management network and an electronic device.

BACKGROUND

It has become a trend to use big data analysis tools to manage daily social affairs with the development of society. With the establishment of the management network, a large amount of field data entry and maintenance work has arisen. Currently, the acquisition of geographic-position-related data mostly relies on on-site positioning by staff using handheld GPS, and then the acquired data is manually imported into a geographic information system. For the geographic information system, the imported data represents only the acquired coordinates, not the type of the target. When the data is entered into the system for application, data reprocessing is required, which not only classifies the data, but also connects the topological relation between the data. This not only results in low efficiency and is more prone to errors in data classification and connection relationships, but also is unable to respond to the changing requirements of the network operating state in time, causing great difficulties to the application of the target management system. This traditional management method is no longer suitable for the future development needs of big data analysis and management. How to quickly and efficiently complete the processing of massive data sources has become a major problem in current big data management network systems.

SUMMARY

In view of this, embodiments of the present application provide a modeling analysis method for a device management network and an electronic device, by which a network model can be automatically constructed for rapid analysis, so that users can check the network diagram and network analysis results in real time, quickly, and automatically, so as to improve the real network of the physical world based on the rapid analysis of the network model.

In a first aspect, an embodiment of the present application provides a modeling analysis method for a device management network, including: acquiring position information and type information of a first node acquired by a user terminal; and displaying the first node on an electronic map according to the position information and the type information of the first node, and establishing, in accordance with a first predetermined rule and on the electronic map, a line connection between the first node and at least one second node displayed on the electronic map.

In a second aspect, an embodiment of the present application provides an operating range analysis method according to the modeling analysis method, including: analyzing an operating line corresponding to the first node in the device management network; and automatically connecting end nodes of the operating line, and forming, in accordance with a predetermined rule and on the electronic map, a closed region corresponding to the first node, the closed region being an operating range corresponding to the first node.

In a third aspect, an embodiment of the present application provides a network model update method, including: dividing an electronic map into multiple regions; during a network update process, when node information for different contents of a same region is received from multiple user terminals, generating a corresponding network model for each of the multiple user terminals to form multiple network models; selecting, based on a first predetermined condition, a network model from the multiple network models, and saving it as a layer to serve as a submitted layer corresponding to a current moment; and when the number of saved submitted layers reaches a threshold, or after a predetermined amount of time has elapsed since a first submitted layer, selecting, based on a second predetermined condition, a submitted layer from multiple submitted layers as a time layer for use in updating a network model.

In a fourth aspect, an embodiment of the present application provides an electronic device, including: a processor; and a memory configured to store instructions executable by the processor, wherein, the processor is configured to execute the modeling analysis method for a device management network described in the first aspect, the operating range analysis method according to the modeling analysis method described in the second aspect, and the network model update method described in the third aspect.

The embodiments of the present application provide a modeling analysis method for a device management network and an electronic device. By establishing a line connection between nodes based on position information and type information of the nodes and a first predetermined rule, and establishing a topological connection between the nodes based on the type information and status information of the nodes and a second predetermined rule, a network model can be automatically constructed for rapid analysis, so that users can check the network diagram and network analysis results in real time, quickly, and automatically, so as to improve the real network of the physical world based on the rapid analysis of the network model. Furthermore, in the modeling analysis method according to the embodiments of the present application, since the data is acquired by the user terminal and the rapid analysis is based on predetermined rules, the workload in data maintenance and analysis in the existing network management systems is reduced, and the management and analysis of geographic data by means of big data is facilitated.

DETAILED DESCRIPTION OF THE EMBODIMENTS

Figure 1:
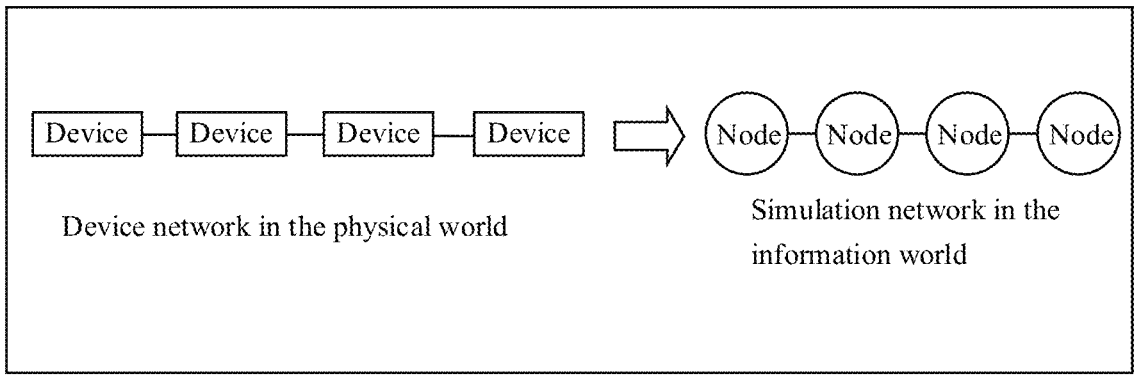
FIG. 1 is a schematic diagram of system simulation according to an exemplary embodiment of the present application.

The technical solutions in the embodiments of the present application will be described clearly and completely with reference to the accompanying drawings in the embodiments of the present application. Apparently, the embodiments to be described are merely some embodiments of the present application, rather than all embodiments of the present application. Based on the embodiments of the present application, all other embodiments obtained by a person of ordinary skill in the art without paying any creative effort are included in the protection scope of the present application.

In order to improve the accuracy of data modeling, Intergraph Corporation in the United States of America has proposed a rule-driven device management solution years ago. ESRI also developed application modules for related products. However, they did not demonstrate an in-depth combination with the data acquisition via mobile clients based on current Internet applications.

Nowadays, based on the emergence of various types of Internet applications, domestic scholars have proposed some new methods for the modeling and analysis of various types of data, mainly including: in the patent application "Method for Checking Power Failure Information Using Image Technology" (Publication No. CN 104317821 A) by State Grid Corporation of China, a user can bind his/her meter number in the WeChat and then send the geographic position to obtain a text content about the information of power outage in the surrounding area. Nonetheless, this method cannot dynamically respond to changes in the operating state of the power grid. The source of the outage data has to depend on the power grid company, which makes the rapid response of information difficult. In the patent application "Mobile Modeling Acquisition System" (Publication No. CN 103425745 A) by GUANGZHOU O CN NETWORK TECHNOLOGY CO. LTD., the acquired pictures are bound with information, achieving an intuitive display of object information. However, it greatly differs from the present application of analyzing the acquired targets as a network node in that the former does not involve dynamic operation analysis of the network. In the patent application "Automatic Guided Vehicle Based on Map Matching and Guide Method of Automatic Guided Vehicle" (Publication No. CN 104596533 A) by Shanghai Jiaotong University, the automatic guided vehicle matches the local environment information currently observed with the global map established in advance by means of its built-in positioning module, and plans a feasible optimal path in the global map using a path planning module. It focuses on the related application of geographic information in the map, and it is different from the method of considering the target as a component of the network and focusing on network analysis in the present application. The commonality of the above-mentioned methods is that they all focus on the use of geographic position information, and they rely more on electronic maps. This application uses the electronic map only as a background reference. With the formation of the network, the geographic target is considered as a component of the network, and more attention is paid to the impact of the operation analysis of the network dynamic change on the related geographic target nodes. So far, no report has been found on the direct application of this technology to network modeling and analysis.

In addition, the modeling methods usually used for the device management network are often limited to the devices in the network. The establishment of network models is limited to the devices that directly constitute the network. The related factors that have a significant impact on the network are not considered as a component of the network. In addition, a network model composed of a limited variety of devices is only a representative of the physical network composition in the current life in the information world, and the network of the physical world cannot be improved through the analysis of the model. FIG. 1 is a schematic diagram of system simulation. It can be found that: first, the one-way mapping from the physical world to the information world causes the model itself to be a reflection of the existing device types, which brings great limitations to the analysis of the model; and second, it is impossible to analyze and improve the real network in the physical world through the change of the simulation model in the information world. The virtual information model is just a one-way mapping of the physical world. The real network in the physical world cannot be improved through the change of the virtual model, and the interaction between the two is quite difficult.

Figure 2:
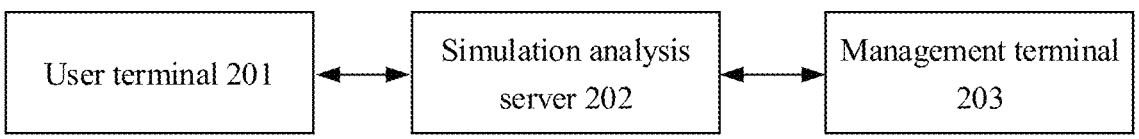
FIG. 2 is an architecture diagram of a device management system according to an exemplary embodiment of the present application.

FIG. 2 is an architecture diagram of a device management system according to an embodiment of the present application. Referring to FIG. 2, a user terminal 201 is in signal connection to a simulation analysis server 202, and the simulation analysis server 202 is in signal connection to a management terminal 203. The user terminal 201 is associated and communicates with the management terminal 203 through the simulation analysis server 202. According to an embodiment, there may be multiple management terminals 203 and user terminals 201, which are respectively in signal connection to the simulation analysis server 202 to form a device management system.

The user terminal 201, the simulation analysis server 202, and the management terminal 203 can communicate with each other through a wired or wireless network. The wired network is, for example, a wired local area network, a wide area network, and a wired telephone communication network. The wireless network is, for example, a wireless local area network, mobile internet (for example, 2G/3G/4G/5G), WiFi, etc. It should be noted that the specific communication methods between them are not limited in the embodiments of the present application.

The user terminal 201 may be a mobile device with a wireless positioning function, such as a mobile phone terminal and a tablet computer. For example, the user terminal 201 may use positioning methods, such as mobile base station positioning, WiFi positioning, GPS positioning, to acquire position information, which is not limited in the embodiments of the present application. In an embodiment of the present application, the management terminal 203 may be a computer, or an all-in-one machine, etc., which is not limited in the embodiments of the present application. The simulation analysis server 202 may be a certain device management network. For example, it may be deployed on some computers, all-in-one machines, or user terminals. Of course, the simulation analysis server 202 may be a cloud server or a local server, which is not limited in the embodiments of the present application. The simulation analysis server 202 may be connected with one or more user terminals 201, and the data acquired by the user terminal 201 may be sent to the simulation analysis server 202 for storage or processing.

Figure 3:
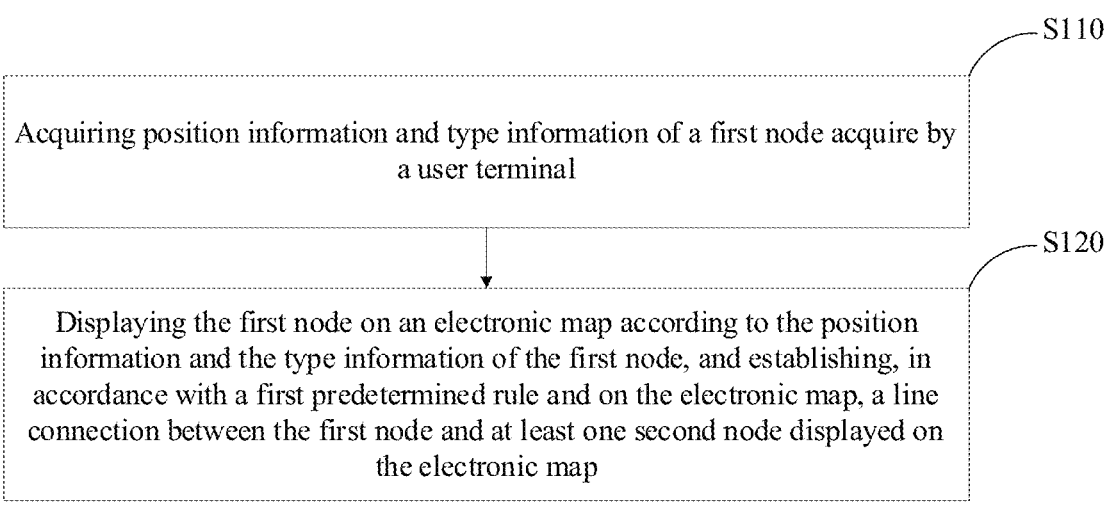
FIG. 3 is a schematic flowchart of a modeling analysis method for a device management network according to an exemplary embodiment of the present application.

FIG. 3 is a schematic flowchart of a modeling analysis method for a device management network according to an exemplary embodiment of the present application. The method of FIG. 3 may be executed by a user terminal or a server. As shown in FIG. 3, the modeling analysis method for a device management network includes the following steps.

S110: acquiring position information and type information of a first node acquire by a user terminal.

The device management network in the embodiment of the present application may include, for example, public facility management systems such as a power grid management system, a water pipeline network management system, or a gas pipeline network system. Of course, it may also include other similar device management networks such as a cable television network and a communication network. It is not limited in the embodiments of the present application. For example, the device network in the physical world corresponds to the simulation network in the information world, i.e., the network model (a simulation network of the device management network), and the various devices in the device network in the physical world correspond to various nodes in the network model. For example, in one example, taking the power grid management network as an example, the nodes in the power grid model may represent switches, transformers, poles, telecommunication base station devices and the like in the power grid. For example, in another example, taking the water pipeline network management system as an example, the nodes in the water pipeline network model may represent valves, water pumping stations, and water treatment plants in the water pipeline network. For example, in another example, taking the gas pipeline network management system as an example, the nodes in the gas pipeline network model may represent gate stations, gas valves, compensators, gas storage devices and the like. It is not specifically limited in the embodiments of the present application, and may be set according to actual needs.

The modeling analysis method according to the embodiment of the present application may be applied to a server, and the server can receive the position information and type information acquired and sent by the user terminal. Or, the modeling analysis method is applied to a user terminal, and the user terminal can directly acquire position information and type information.

Regardless of whether the modeling analysis method is applied to the server or the user terminal, the way for the user terminal to acquire position information and type information of the first node includes at least one of user inputting, positioning function of the user terminal, and photographing and automatic recognition functions of the user terminal.

The first node may correspond to a physical device in the real world. Taking the device management network being the power grid as an example, the physical devices may be substations, ring main units, public transformers, switches, poles, etc. In a device management network, a node may be a basic unit, and each type of devices in the real world is a kind of nodes. By replacing actual physical devices with nodes, the display of the network diagram of the device management network may be facilitated. That is, the node is the reflection of various physical devices in the real world in the simulation network model.

In one example, the operator carries a mobile device (for example, a mobile phone) with a wireless positioning function to acquire information about nodes along a predetermined route (for example, along a street in a certain region). The information about nodes includes at least one of position information, type information, and image information.

For example, the operator obtains, as the position information of this node, the positioning information of a user terminal (for example, a mobile phone) by positioning the user terminal at a certain device (for example, a ring main unit) on the side of the street. For example, the operator (or user) may select or input the position and type of the device on the user terminal. For example, the operator (or user) may select the device type, for example "transformer", on the user terminal. For example, the operator (or user) may input the position information of the device, for example the longitude and longitude, on the user terminal. For example, the operator may select or input the No. and name of the device on the user terminal, for example "switch No. 1". For example, the operator may take photos of the device and its surrounding environment by the user terminal, so that the device type and the position of the device may be automatically recognized based on the captured device image. In this way, the user terminal can acquire the position information, type information, image information, etc., of the node, which is not specifically limited in the embodiments of the present application.

S120: displaying the first node on an electronic map according to the position information and the type information of the first node, and establishing, in accordance with a first predetermined rule and on the electronic map, a line connection between the first node and at least one second node displayed on the electronic map.

Specifically, similar to the first node, the second node also corresponds to a physical device in the real world. The device types corresponding to the first node and the second node may be the same or different. The second node is displayed on the electronic map according to the position information and type information of the second node acquired by the user terminal. A connection is established between the first node and the second node in the network model in accordance with a preset connection rule, so that the first node is added to the network model.

For the device management network to be modeled, first, the device types involved in the network are listed, the devices are defined as nodes, and connection rules between various types of nodes are defined, i.e., the first predetermined rule. For example, taking the power grid model as an example, the first predetermined rule may include a rule that a pole node is automatically connected to another pole node closest to it. For example, the first predetermined rule may include a rule that a switch node is automatically connected to the closest transformer node.

That is, the first predetermined rule may define, in advance, connection rules between nodes and surrounding nodes. For example, the first predetermined rule includes a rule that a pole node is automatically connected to other pole nodes within a radius of 50 m centered on this pole node. It should be noted that, in the embodiments of the present application, the first predetermined rule may be set based on experience, actual needs, etc., which is not specifically limited in the embodiments of the present application.

In one example, taking the electronic map as the background, lines between the nodes are automatically displayed at corresponding positions. For example, the electronic map may be stored locally or downloaded from the network, which is not limited in the embodiments of the present application.

Optionally, as another embodiment, the method of FIG. 3 further includes S130: acquiring status information of the first node acquired by the user terminal; and establishing, according to the type information and the status information of the first node, a topological connection between the first node and the at least one second node.

Specifically, the user terminal may acquire the status information (for example, operating status) of the nodes. For example, the operator may select or input the status of the devices on the user terminal, for example, select "connected" or "disconnected".

Based on different types and operating statuses (for example, connected or disconnected) of the nodes, the first node may be connected to the surrounding second nodes in accordance with a second predetermined rule, to determine a topological relationship between adjacent nodes in the network, that is, the topological structure of the device management network, which is the basis for network diagram analysis. For example, taking power grid modeling as an example, the second predetermined rule may include a rule that a substation node is automatically connected to a switch node closest to it, and a switch node is automatically connected to the closest transformer node. It should be noted that the second predetermined rule may be set based on experience, actual needs, etc., which is not specifically limited in the embodiments of the present application.

In one example, the second predetermined rule may be defined as follows: the substations are used as the original power supply points, the power to the switches comes from the substations or the upper-level switches, and the power to the transformers comes from the switches. In accordance with such a second predetermined rule, a topological connection among the substations, the switches and the transformers may be established in the device management network.

In this embodiment, the topological connection and line connection may be arranged on a same layer in the device management network, so that the nodes corresponding to the devices, which are acquired by the user terminal, may be displayed in a same layer of the network. That is, the topological connection and line connection between the nodes may be displayed. In an embodiment, the line corresponding to the topological connection in the network may overlap, partially overlap, or not overlap with the line corresponding to the line connection.

Through the line connection between nodes, the number and position of various types of devices in a certain region can be known quickly, which is of great significance to the construction of urbanization. For example, when demolition, road construction or line reconstruction is planned for a certain region, by checking the type and position of nodes in the device management network, it may be easily known which devices corresponding to the nodes may be demolished, and it is convenient to take measures after the device removal to ensure the normal operation of the actual device network.

Taking the power grid model as an example, through the topological connection between the nodes, the upper-level power supply source in a certain region may be known quickly. Thus, in the event of power outage, the cause of the power outage may be quickly determined, which is convenient for making decisions, such as repairing the faulty power supply source or timely replacing the faulty power supply source for this region.

It should be noted that, in the embodiments of the present application, steps S110-S130 may be executed sequentially, or executed in other adjusted orders; and, some or all of the steps may be executed in parallel, for example, step S120 and step S130 may be executed simultaneously.

In other embodiments, some of the steps in the modeling analysis method may be executed on the user terminal, and the other steps may be executed on the server side, which is not limited in the embodiments of the present application.

The embodiments of the present application provide a modeling analysis method for a device management network. By establishing a line connection between nodes based on position information and type information of the nodes and a first predetermined rule, and establishing a topological connection between the nodes based on the type information and status information of the nodes and a second predetermined rule, a network model can be automatically constructed for rapid analysis, so that users can check the network diagram and network analysis results in real time, quickly, and automatically, so as to improve the real network of the physical world based on the rapid analysis of the network model.

Figure 4:
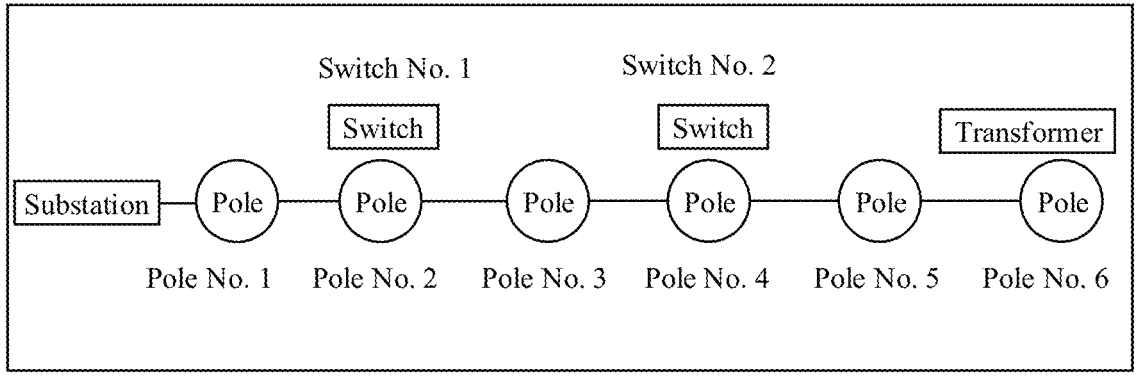
FIG. 4 is a schematic diagram of a power grid model according to an exemplary embodiment of the present application.

FIG. 4 is a schematic diagram of a power grid model according to an exemplary embodiment of the present application. In order to facilitate the rapid display of the power grid, each type of power grid devices in the real world corresponds to a type of nodes in the power grid model. The power grid model includes four types of devices: poles, substations, switches, and transformers. It should be noted that the type of power grid devices is not limited in the embodiments of the present application. For example, the substations are used as power supplies to supply power to the power grid; the poles play a role of supporting; the wires between the poles constitute the physical lines of the power grid; the switches play a segmented control role in the lines; the transformers are the final power consuming devices; and the switches and the transformers are mounted on the poles.

In one example, in order to facilitate the rapid establishment of the power grid diagram, the first predetermined rule may be defined as follows: in the compositions of the line, starting from the power supplies (substations), the serial number of the second device is the serial number of the first device plus 1. For example, starting from the pole No. 1, if next devices to be added are poles, these nodes will automatically be named the pole No. 2, the pole No. 3, and so on. If a next device to be added after the pole No. 1 is a switch, this switch will be manually named (for example, by selecting or inputting) the switch No. 1. If a next device to be added is still a switch, this switch will be automatically named the switch No. 2, and so on. In this way, with the continuous increase of poles, a pole as the basic unit is automatically connected to the pole of previous serial number. For example, correspondingly, the serial numbers of the switches mounted on the poles are automatically increased. In this way, the displaying of the power grid diagram, with the electronic map as the background, may be quickly completed, as shown in FIG. 4.

In one example, the increasing direction of the serial number of nodes of each type may indicate the direction of the signal or fluid in the device management network. For example, the device management network is a power grid management network, and the direction of the signal or fluid in the device management network may be the power supply direction in the power grid management network. For another example, the device management network is a water pipeline management network, and the direction of the signal or fluid in the device management network may be the direction of water supply. For another example, the device management network is a gas pipeline management network, and the direction of the signal or fluid in the device management network may be the direction of gas supply.

For example, in the power grid model shown in FIG. 4, taking the poles as an example, the increasing direction of the serial number of the poles may indicate the power supply direction of the power grid. That is, it may be defined that the power supply direction is from a pole with a small serial number to a pole with a big serial number. In this case, by identifying the serial number of the pole, the current flow direction, i.e., the power supply direction, may be displayed. For example, the power supply direction may be from the pole No. 1 to the pole No. 2 then to the pole No. 3, and so on. For example, the power supply direction may be from the switch No. 1 to the switch No. 2 then to the switch No. 3, and so on. Of course, in a case where the power grid operation mode is adjusted, the power supply direction may be from the pole No. 6 to the pole No. 6 then to the pole No. 4, and so on. The power supply direction is not limited in the examples of the present application, and may be set according to actual needs.

For the network model, based on information about the device nodes (i.e., physical nodes) acquired by the user terminal (for example, a mobile phone), and in accordance with a predetermined connection rule (for example, the first predetermined rule), the acquired physical nodes are automatically connected to form a line. A network diagram is quickly established, without manual drawing.

According to an embodiment of the present application, the modeling analysis method for a device management network further includes: displaying the first node on the electronic map according to the position information and the type information of the first node, and establishing, in accordance with the first predetermined rule and on the electronic map, a line connection between the first node and at least one third node displayed on the electronic map.

In this embodiment, the connection between the first node and the second node is a topological connection, and the connection between the first node and the third node is a line connection. Nodes in the device management network may be referred to as physical nodes, among which nodes that meet a predetermined condition (which may be referred to as a third predetermined condition to distinguish from the first and second predetermined conditions below) may be referred to as logical nodes. The interconnection of logical nodes can form the logical layer of the network model, and the interconnection of physical nodes can form the physical layer of the network model.

In one example, the predetermined condition may be the participation in the logical judgment in the network model, that is, participation in the status analysis of the network model. In this way, the number of physical devices involved in the network model may be greatly reduced, and retrieval efficiency may be improved. The logical layer mainly refers to a logical layer composed of these simplified logical nodes. It should be noted that the specific content of the predetermined condition is not limited in the embodiments of the present application, and may be set according to actual needs. Taking power grid modeling as an example, if the power grid devices in the physical layer are all regarded as logical nodes, they will all participate in the analysis of the network, resulting in huge retrieval workload. In order to improve the retrieval efficiency of the network, devices participating in the logical judgment (status judgment) in the power grid system and power consuming devices used as line terminals are regarded as logical nodes.

In this embodiment, the first node and the second node are logical nodes since they meet the predetermined condition, and the third node is a physical node since it does not meet the predetermined condition. A topological connection between the first node and the second node is established, so that the first node is added to the logical layer.

According to an embodiment of the present application, the physical layer is mainly used for displaying, and the logical layer is mainly used for analysis. The devices that may be seen are all physical nodes. The physical layer may be used to display the path of the line. It is difficult to display the turning of the circuit if there is no physical layer. The logical layer may determine the power supply source of the devices and analyze the power outage condition. The separation of the physical layer and the logical layer into different layers can improve the retrieval efficiency of the network. Or, the physical layer and the logical layer are in a same layer, and all nodes are logical nodes. For example, the poles are also logical nodes. This can simplify the programming process.

Figure 5:
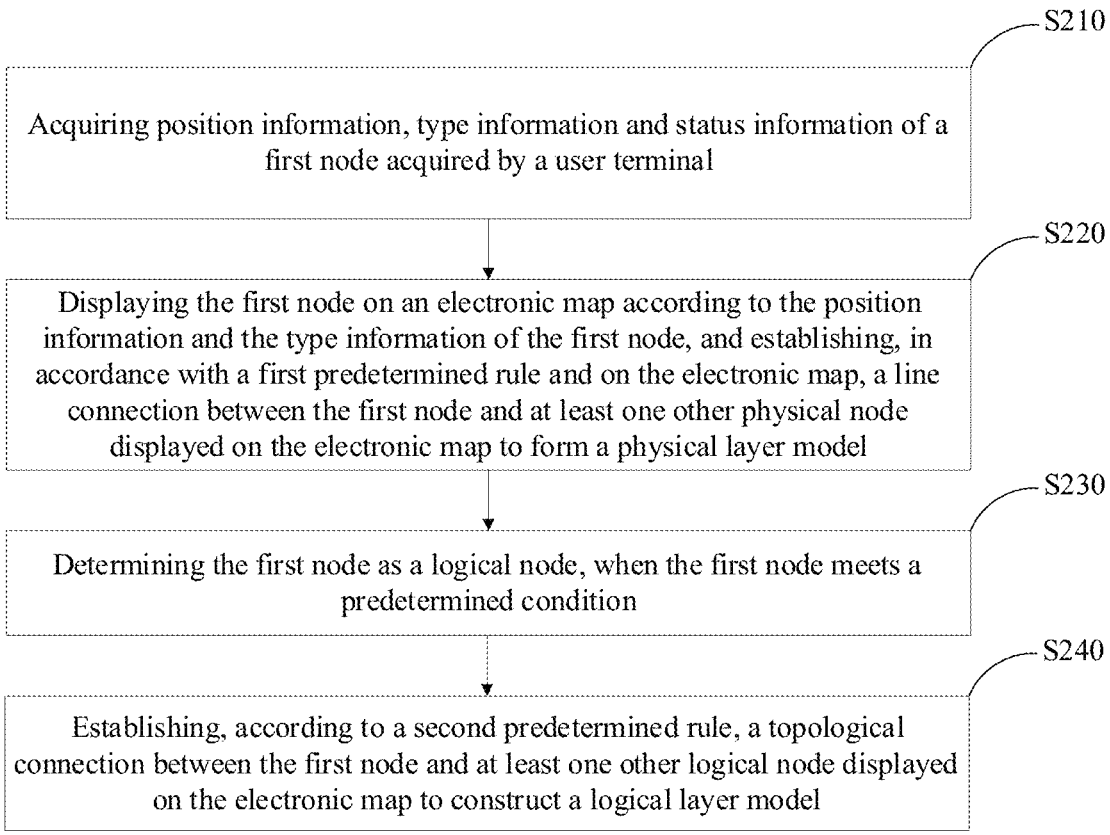
FIG. 5 is a schematic flowchart of a modeling analysis method for a device management network according to another exemplary embodiment of the present application.

FIG. 5 is a schematic flowchart of a modeling analysis method for a device management network according to another exemplary embodiment of the present application. The embodiment of FIG. 5 is an example of the embodiment of FIG. 3. The differences will be mainly described here, without repeating the similarities. As shown in FIG. 5, the modeling analysis method for a device management network includes the following steps.

S210: acquiring position information, type information and status information of a first node acquired by a user terminal.

S220: displaying the first node on an electronic map according to the position information and the type information of the first node, and establishing, in accordance with a first predetermined rule and on the electronic map, a line connection between the first node and at least one other physical node displayed on the electronic map to form a physical layer model.

In one example, for the physical layer model, after defining the types of physical devices and a connection rule, based on the acquired device information, a diagram using the electronic map as the background may be formed to visually display the types and distribution of various physical devices. This is the basis for the quick display of the network diagram. For example, during the establishment of the physical layer model, the received point devices can be automatically connected according to the first predetermined rule to form a line. In one example, when a network is established, based on the principle of determining a line by two points, only the nodes at both ends are acquired and then a connection line between the two points is automatically generated according to a predetermined connection rule. In this case, the first point is a definite node. When a second node is acquired, which node the first node is to be connected to is determined by a predetermined connection rule (for example, the first predetermined rule). This is the basis for the rapid establishment of the network model and also the basis for the rapid display of the network diagram.

S230: determining the first node as a logical node, when the first node meets a predetermined condition.

Specifically, it may be determined whether the first node meets the predetermined condition (the third predetermined condition) according to the type information and status information of the first node.

S240: establishing, according to a second predetermined rule, a topological connection between the first node and at least one other logical node displayed on the electronic map to construct a logical layer model.

Specifically, the network model obtained by modeling includes a physical layer model and a logical layer model.

Figure 6:
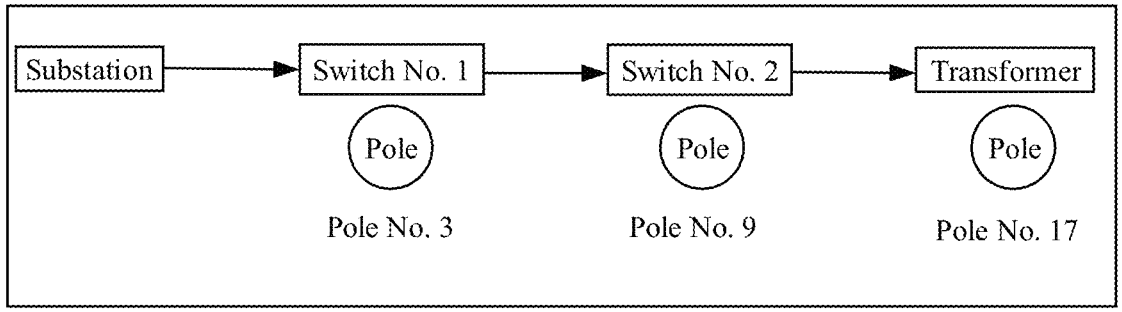
FIG. 6 is a schematic diagram of a logical layer model of the power grid according to an exemplary embodiment of the present application.

FIG. 6 is a schematic diagram of a logic layer model of the power grid according to an exemplary embodiment of the present application. Taking power grid modeling as an example, logical nodes include three types of devices: substations, switches, and transformers. As shown in FIG. 6, the substations supply power to the switches, and the switches supply power to the transformers. The poles, which play the only role of supporting, do not participate in the network analysis of the system, so they are not devices corresponding to the logical nodes.

In one example, the second predetermined rule may be defined as follows: the substations are used as the original power supply points, the power to the switches comes from the substations or the upper-level switches, and the power to the transformers comes from the switches. In accordance with such a second predetermined rule, first, the position of the substations as the power supply points is defined on the electronic map of the physical layer. With the appearance of a switch, the closest substation or switch is automatically searched. The upper-level power supply is determined based on the serial number of the pole corresponding to the switch, and then a logical connection is established between them. With the appearance of a transformer, the closest switch is automatically searched. The appropriate power supply point is determined, and then a logical connection is established between them. In this way, the logical layer of the power grid may be quickly established, as shown in FIG. 6.

In an embodiment, step S120 and step S130 may be executed synchronously, that is, the physical layer model and the logical layer model may be constructed at the same time, so as to quickly construct a network model and quickly display a network diagram with an analysis function.

Therefore, in the modeling analysis method for a device management network according to embodiments of the present application, data may be acquired by the user terminal, the physical display of devices and the logical relationships of devices may be automatically processed at one time in accordance with the predetermined connection rules, and the subsequent change in the rules will automatically change the connection of the logical relationships, so that users can check the network diagram and network analysis results in real time, quickly, and automatically, so as to improve the real network of the physical world based on the rapid analysis of the network model. In addition, by selecting logical nodes from physical nodes, the retrieval workload is greatly reduced and the retrieval efficiency of the network is improved.

According to an embodiment of the present application, the modeling analysis method for a device management network further includes: when the position information and/or the type information of the first node is changed (or updated) by the user terminal, based on changed position information and/or changed type information, by using the electronic map as a background, automatically disconnecting a line among original lines that does not conform to the first predetermined rule, and automatically forming a line between a changed first node and at least one third node in accordance with the first predetermined rule.

In an embodiment, it is assumed that the existing power grid model includes a node No. 1, a node No. 2, and a node No. 3, the node No. 1 is in line connection to the node No. 2, and the node No. 2 is in line connection to the node No. 3. In a case where the nodes No. 1, No. 2 and No. 3 are all poles, when the user moves the pole node No. 2 by, for example, a mobile phone terminal, that is, when the position information of the node No. 2 is changed, the power grid model automatically disconnects the line connections between the pole node No. 2 and the nodes No. 1 and No. 3, and based on the changed node information, in accordance with the first predetermined rule, automatically forms line connections between the moved pole node No. 2 and the pole nodes No. 1 and No. 3. It should be noted that, based on the changed node information, in accordance with the first predetermined rule, if the pole node No. 2 is still in connection to the pole node No. 1 and the pole node No. 3, due to the rapid update of the model, the user may find on the mobile phone interface that the line connection between the node No. 1 and the node No. 2 and the line connection between the node No. 2 and the node No. 3 move along with the movement of the node No. 2.

In an embodiment, in a case where the nodes No. 1, No. 2 and No. 3 are all poles, when the user adds a new pole node No. 4 between the pole node No. 2 and the pole node No. 3 by, for example, a mobile phone terminal, the power grid model automatically disconnects the line connection between the node No. 2 and the node No. 3, and based on the changed node information, in accordance with the first predetermined rule, automatically forms line connections between the node No. 2, the node No. 3 and the node No. 4. If the original line between the node No. 2 and the node No. 3 overlaps with the updated lines between the node No. 2, the node No. 3 and the node No. 4, due to the rapid update of the model, the user may find on the mobile phone interface that a node No. 4 is added to the line between the node No. 2 and the node No. 3.

In an embodiment, in a case where the nodes No. 1, No. 2 and No. 3 are all poles, when the user deletes the pole node No. 2 by, for example, a mobile phone terminal, the power grid model automatically disconnects the line connections between the pole node No. 2 and the pole nodes No. 1 and No. 3, and based on the changed node information, in accordance with the first predetermined rule, automatically forms a line connection between the pole node No. 1 and the pole node No. 3. Due to the rapid update of the model, the user may find on the mobile phone interface that a line connection between the node No. 1 and the node No. 3 is automatically formed while the node No. 2 disappears from the electronic map.

In an embodiment, in a case where the node No. 1 is a substation, the node No. 2 is a switch, and the node No. 3 is a transformer, when the user deletes the node No. 2 by a mobile phone terminal, if the node No. 1 cannot be directly connected to the node No. 3 in accordance with the first predetermined rule, the user may find on the mobile phone interface that the line connections between the node No. 2 and the nodes No. 1 and No. 3 is automatically disconnected while the node No. 2 disappears from the electronic map.

Therefore, by the modeling analysis method according to the embodiments of the present application, when the physical node information changes, for example, a certain physical node is moved, deleted, or added, the physical layer model will automatically change, that is, a line connection will be automatically formed based on the changed physical node information. This avoids the waste of huge human resources to manually modify the lines and also avoids the connection fault.

According to an embodiment of the present application, a physical layer model may be automatically constructed in accordance with the first predetermined rule and based on the position information and type information of the physical nodes. Further, while the user terminal keeps moving, in response to the acquisition of the position information and type information of a physical node, the physical node and an automatically generated line between the physical node and an adjacent physical node are displayed in real time. For example, when the user acquires information about the surrounding nodes along a route while walking with a user terminal (for example, a mobile phone), in response to the acquisition of information about nodes, the user terminal will automatically display a acquired physical node and a line between this physical node and an adjacent physical node on the electronic map in real time. In this way, the user can check the network diagram on the user terminal in real time, quickly and automatically.

In order to extend the existing network model without destroying the original physical layer model and logical layer model, an embodiment of the present application further provides a modeling analysis method for a device management network. The modeling analysis method further includes the following steps on the basis of those shown in FIG. 3 or FIG. 5.

S310: acquiring position information of an additional node, and acquiring type information and status information of the additional node.

S320: constructing, based on the position information, the type information, and the status information of the additional node, an additional layer model for extending the device management network.

S330: automatically displaying, by using the electronic map as a background, the type information and the status information of the additional node at a corresponding position.

In an embodiment, the additional node corresponds to an additional device that appears with the extension of system functions and has a significant impact on system analysis. For example, the additional device may be a basic constituent part for a certain auxiliary status. With the increase of system functions, there may be many kinds of such auxiliary statuses, and each status may have many constituent units. The additional device is added after the network model is constructed, and may be displayed as new physical units, without affecting the original physical connection of the network, or may be regarded as new logical units to participate in the analysis, without affecting the original logical connection of the network. Additional nodes exist as additional statuses of physical or logical networks, which have more effects on the analysis of the network. Additional nodes in the additional layer model include a physical status of the additional device, or a logical connection status of the additional device, or both. The additional device may be a device with a physical status, which is directly added to the device type for the physical layer model, for the purpose of diagram displaying. Since they are added to the diagram later, they will not destroy the connection of the original devices and will not affect the displaying of the original physical network. The additional device may be a device with a logical connection status. The connection between the devices may be based on a certain rule, or may be formed without any rule. They can participate in network analysis to enrich the content of system analysis. The additional layer model is the basis for the continuous extension of the network model and also the basis for advanced network analysis.

Figure 7:
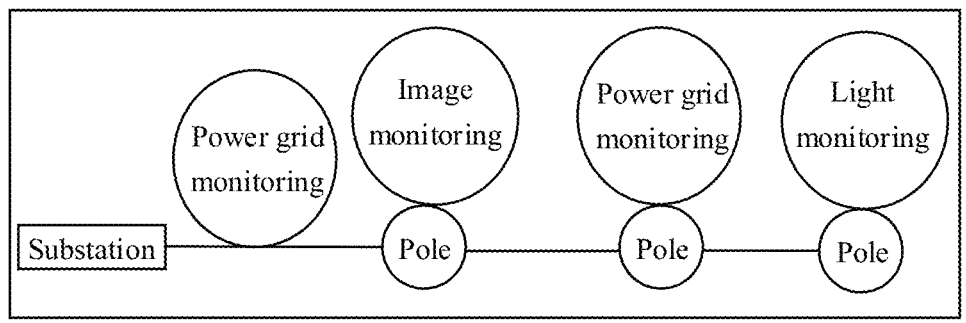
FIG. 7 is a schematic diagram of an additional layer model of the power grid according to an exemplary embodiment of the present application.

FIG. 7 is a schematic diagram of an additional layer model of the power grid according to an embodiment of the present application. Taking power grid modeling as an example, as shown in FIG. 7, the additional device in the power grid system may be a power grid monitoring device attached to a pole or wire, or may be a device that sends light or images to a pole with a receiving function, for example, an image monitoring device, a light monitoring device, etc., which is not limited in the embodiments of the present application. For example, the additional device may not be a basic constitute unit of the physical layer in the power grid model, and the power grid may not rely on the additional device. The additional device may not be a basic constitute part of the logical layer in the power grid model, and the basic analysis of the network may not rely on the additional device. Depending upon different functions of the additional devices, a additional device may be directly mounted on the wire or pole to monitor the current, may make a determination on power outage indirectly by the surrounding light sources, and may provide an early warning of power outage by analyzing the images of the surrounding fires. With the extension of system functions in the future, more sources of additional information may be extended, which is not limited in the embodiments of the present application. For example, the additional device may be a physical device, for example, a power grid monitoring device, which may be displayed in the constitution of the physical network and may participate in network analysis at the logical layer. For another example, the additional device may be non-physical device information such as light and images, and may participate in network analysis only at the logical layer. Since the additional device is added after the construction of the basic physical layer model and logical layer model, it does not affect the original connections of the physical layer and the logical layer. However, it plays a dramatic role in the advanced analysis of the power grid.

For example, in the device type of the additional layer, the grid monitoring device is mounted on a pole or a line. It monitors whether the power grid has electricity in real time by providing information, and participates in the analysis of the power supply status of the power grid. Therefore, it has a physical status and a logical connection status. Its mounting position may be displayed in the power grid diagram, and may be used as part of the line or device attributes, so that the line or device participates in the logical analysis, as shown in FIG. 7.

Figure 8A:
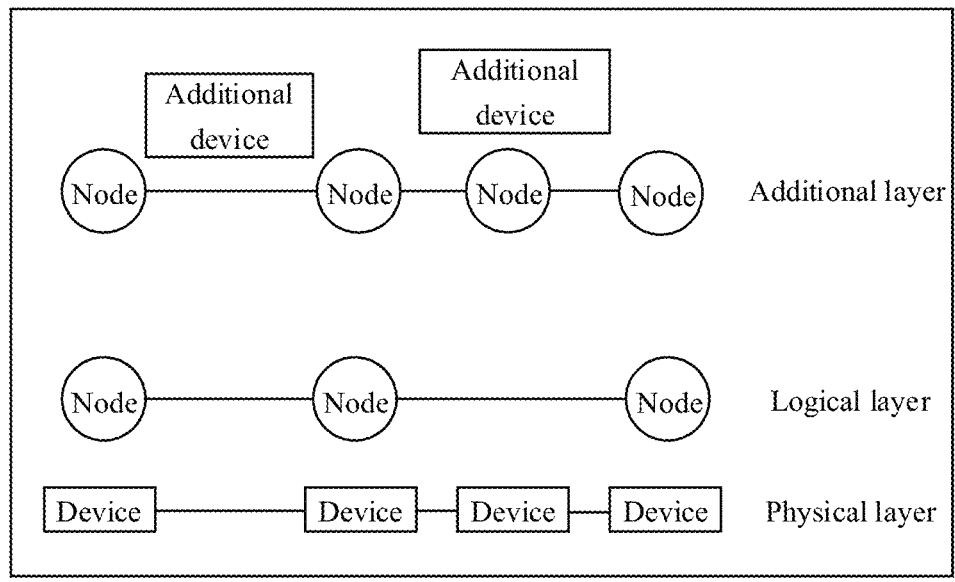
FIG. 8A is a hierarchical diagram of the system structure according to an exemplary embodiment of the present application.
Figure 8B:
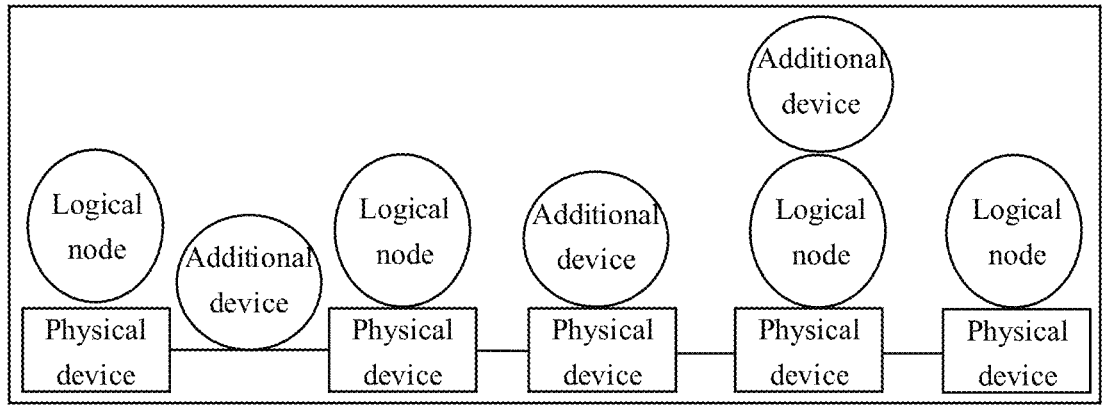
FIG. 8B is a schematic diagram of a simulation system model according to an exemplary embodiment of the present application.
Figure 8C:
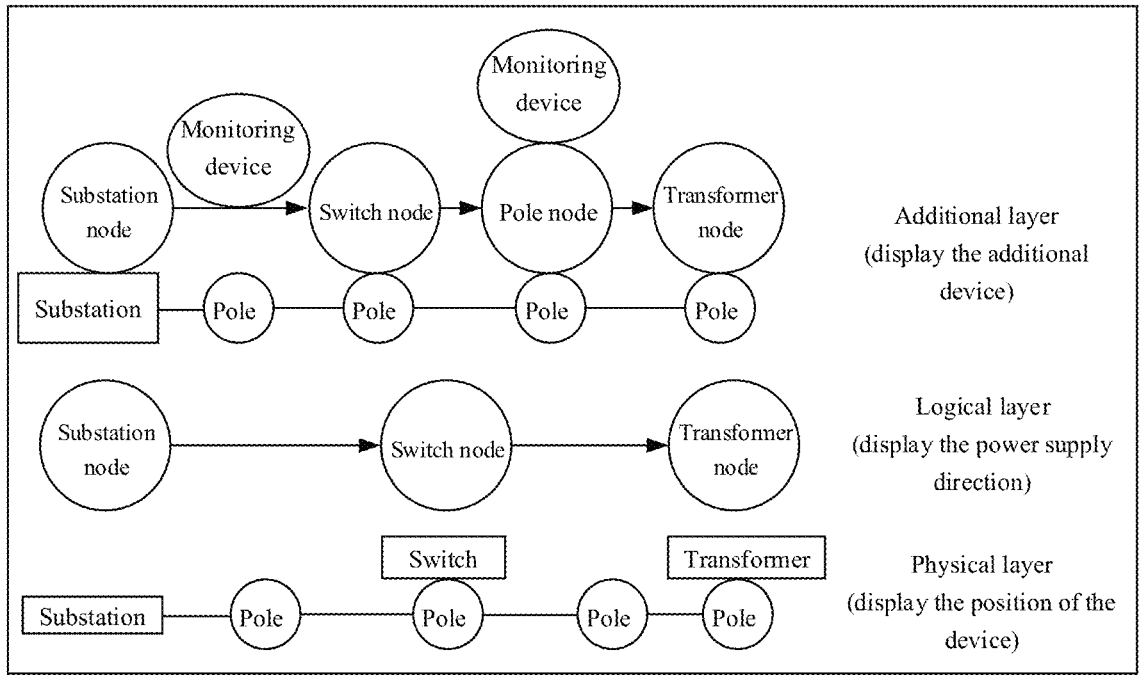
FIG. 8C is a view of a power grid system according to an exemplary embodiment of the present application.

FIG. 8A is a hierarchical diagram of the system structure according to an embodiment of the present application, FIG. 8B is a schematic diagram of a simulation system model according to an embodiment of the present application, and FIG. 8C is a diagram of a power grid system according to an embodiment of the present application.

As shown in FIGS. 8A and 8B, the physical layer model, the logical layer model, and the additional layer model are superposed to form the complete structure of the network model. For example, based on the acquired position information, type information, and status information of various physical devices, different types of devices are processed differently to quickly complete the construction of a simulation network model, for example the simulation network model shown in FIG. 8B.

In an example, taking power grid modeling as an example, as shown in FIG. 8C, when the network model is established, the physical layer model and logical layer model of the power grid may be automatically and synchronously completed in accordance with the predetermined physical and logical connection rules. Various monitoring devices are added to the additional layer. For example, the physical layer model enables the power grid diagram to be displayed normally, the logical layer model enables the power grid diagram to have an analysis function, and the additional layer model enables the power grid diagram to perform analysis and judgment automatically and quickly. The three layers together form a network model that can display the status of the power grid in real time and can quickly and automatically provide fault analysis results, for example, power outage analysis results.

In an example, taking power grid modeling as an example, as shown in FIG. 8C, starting from a power supply that is a substation, poles and devices are acquired in order of numbering. According to the different types of devices, the physical layer network and the logical layer network are synchronously established. Then, according to the position of the monitoring devices on the poles and wires, the devices are displayed on the power grid diagram at the physical layer. Meanwhile, the monitoring devices are added to the additional layer as the attributes of the wires and poles on which they are mounted. By displaying the power grid status information (power available or power outage), the wires and poles that do not have a logical analysis function participate in the logical analysis, as part of the advanced analysis of the power grid, to establish a network model that can display the status of the power grid in real time.

In an example, the modeling analysis method may further include: displaying, according to the topological relationship between the logical nodes in the logical layer model and on the electronic map, a direction of a signal or fluid in the device management network.

In an example, displaying, on the electronic map, the direction of a signal or fluid in the device management network includes: displaying, by a line with an arrow and on the electronic map, the direction of the signal or fluid in the device management network. Of course, the direction of the signal or fluid may be displayed in other methods (for example, simulation analysis results, etc.), which is not limited in the embodiments of the present application.

In an example, the device management network may be a power grid management network, and the direction of the signal or fluid in the device management network is the power supply direction in the power grid management network. Of course, it is not limited in the embodiments of the present application.

In an example, the modeling analysis method may further include: in response to an analysis function button in a scene interface being triggered, displaying a corresponding simulation analysis result.

Specifically, the network model established based on step S120 and step S130 has a network analysis function. For example, there are analysis function buttons in the scene interface displayed by the user terminal. When the user triggers a certain analysis function button, in response to the analysis function button in the scene interface being triggered, the user terminal will display a corresponding simulation analysis result. For example, taking power grid modeling as an example, when the user triggers a power outage analysis button on the user terminal, the user terminal will automatically display a corresponding power outage analysis result.

In an example, the modeling analysis method is applied to a power outage management system for users. Displaying, in response to the power outage analysis function in the scene interface being triggered, a power outage analysis result includes: receiving a user's inquiry sent by the user terminal; marking a position of the user on the electronic map; determining at least one power grid device associated with the user according to the position; and analyzing power outage situation according to the at least one power grid device, and notifying the user of the power outage situation.

In an example, the device management network is a power grid management network, the first node is a switching device, and establishing, according to the type information and the status information of the first node and in accordance with a second predetermined rule, a topological connection between the first node and at least one second node includes: establishing, according to operating status of the switching device and in accordance with the second predetermined rule, the topological connection between the switching device and at least one second node.

In an example, in response to the analysis function in the scene interface being triggered, the simulation analysis result is displayed by controlling the change in color of the line. For example, if a switch in a certain power grid line is turned off to cause a power outage situation, then, in response to the power outage analysis function in the scene interface being triggered, the user is notified of the power outage situation of the line by changing the color of the line controlled by the switch. Of course, the user can be notified of the power outage situation of the line in other ways, for example, sending a message to the user in a specific region, which is not specifically limited in the embodiments of the present application.

In an example, the operation of displaying, in response to the analysis function in the scene interface being triggered, a simulation analysis result may be automatically executed online by the user terminal in real time, for example, via the mobile internet, which is not limited in the embodiments of the present application.

In an example, the operation of acquiring, by the user terminal, the position information, type information and status information of the physical node may be executed online in real time via the mobile internet, and the user terminal can be automatically connected to the Internet in other ways. It is not limited in the embodiments of the present application.

In an example, after performing the data acquisition operation (for example, step S110 or step S310), the user terminal may send, via the mobile internet (for example, 5G, 4G, etc.,), the acquired node information (for example, the position information, type information, and status information of the physical node and/or additional node) to a simulation analysis server to be used to construct a network model on the simulation analysis server side, and then, receive a simulation analysis result from the simulation analysis server via the mobile internet, for the purpose of displaying. Of course, the specific communication method between the user terminal and the simulation analysis server is not limited in the embodiments of the present application. The specific operations on the simulation analysis server side will be described in detail below.

In an example, the user terminal (for example, a mobile phone) may be automatically connected to the internet via the mobile internet, and the modeling analysis method may be automatically executed by the user terminal online in real time, which is not limited in the embodiments of the present application.

By the modeling analysis method according to the embodiments of the present application, a network model is established quickly in a classification and hierarchical manner, in accordance with predetermined rules (for example, the first predetermined rule, the second predetermined rule, etc.). Through the superposition of the additional layer, a space is reserved for unlimited network extension, without affecting the original network structure. The modeling analysis method according to the embodiments of the present application has, but is not limited to, the following advantages.

First, the establishment of the existing network model requires a lot of manual participation. It is often necessary to manually establish a logical connection after acquiring the position and attribute information of the devices. As the logical relationship changes (for example, the relationship between the power grid devices changes from a parent-child relationship to a connected relationship), the logical connection between the devices needs to be manually processed.

Figure 9A:
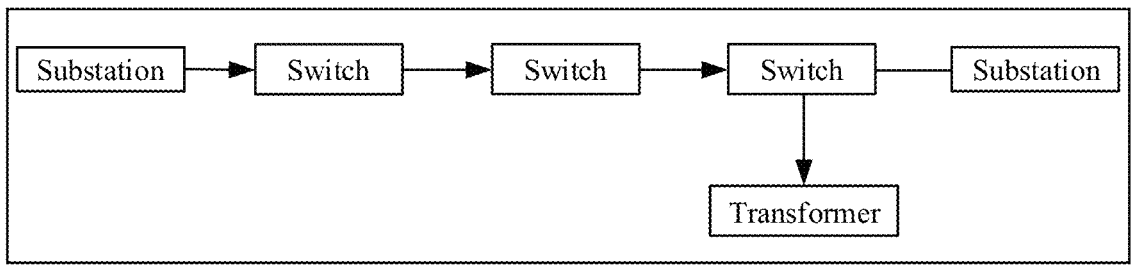
FIG. 9A is a schematic diagram of dual power supply according to an exemplary embodiment of the present application.
Figure 9B:
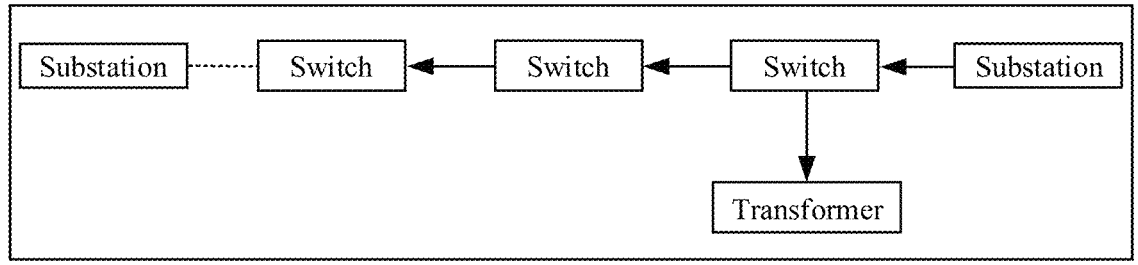
FIG. 9B is a schematic diagram of conversion of dual power supply according to an exemplary embodiment of the present application.

FIG. 9A is a schematic diagram of dual power supply according to an embodiment of the present application, and FIG. 9B is a schematic diagram of conversion of dual power supply according to an embodiment of the present application. As shown in FIG. 9A, in the case of dual power supply, normally, the substation on the right is in the off-state indicated by a dotted line, and the power comes from the substation on the left. Then, the substation on the left supplies power to the transformer by switches stepwise. The power supply direction between the devices may be expressed in a logical relationship from parent to child. As shown in FIG. 9B, when the substation on the left is in the off-state indicated by the dotted line, the power comes from the substation on the right. As shown, the power supply direction of the switches changes. In this case, the original parent-child relationship is wrong, and the parent-child relationship between the devices in the model must be changed to a connected relationship. In this case, by the modeling analysis method according to the embodiments of the present application, it is just needed to change the settings of the connection rule of the model to automatically complete the rapid adjustment of the logical relationship, without needing major adjustments.

Second, the extension of the existing network model is limited. With the addition of new types of devices, the original model structure must be modified. By the modeling analysis method according to the embodiments of the present application, the establishment of the third additional layer provides an opportunity for the unlimited extension of the network model; and, the addition of new devices does not destroy the display of the existing physical layer and the structure of the logical layer connection, without great impact on the existing model, just an additional effect.

Third, the number of logical devices is simplified, and the efficiency of retrieval and analysis is greatly improved. By the definition of devices at the logical layer and the additional layer, the number of devices participating in network analysis may be automatically adjusted at any time. This greatly improves the efficiency of retrieval and analysis, and facilitates the change of network analysis model.

The modeling analysis method performed by the user terminal according to the embodiments of the present application has been described above, the modeling analysis method performed by a management terminal according to the embodiments of the present application will be further described below. This method corresponds to the method in the above embodiments. For brevity of the description, only a brief description is given below. For details, please refer to the modeling analysis method in the above embodiments.

An embodiment of the present application provides a modeling analysis method for a device management network, which is applied to a management terminal, including the following steps.

S410: acquiring position information, type information, and status information of physical nodes.

For example, the way for a management terminal to acquire information about physical nodes may be: manually entering node information into the management terminal by an operator, or reading the node information stored locally, or downloading the node information from the internet, or scanning pictures for automatic identification of node information, etc. The way for the management terminal to acquire node information is not limited in the embodiments of the present application.

S420: automatically constructing, based on the position information and type information of the physical nodes, and in accordance with a first predetermined rule, a physical layer model to automatically form a line between the physical nodes, and automatically displaying, by using an electronic map as the background, the physical nodes and the line between the physical nodes at a corresponding position.

S430: automatically constructing, based on the type information and status information of the physical nodes, and in accordance with a second predetermined rule, a logical layer model to construct a network model.

In the embodiment of the present application, the operations of step S420 and step S430 may be the same as or similar to the above-mentioned step S120 and step S130, respectively. For the description of these operations, please refer to the relevant description of step S120 to step S130, which will not be repeated here.

In an example, corresponding to the above steps S310-S320 performed by the user terminal, the management terminal may obtain position information, type information, and status information of an additional node; construct, based on the position information, type information, and status information of the additional node, an additional layer model for extending the network model; and automatically display, by using the electronic map as the background, the type information and status information of the additional node at a corresponding position.

In the embodiment of the present application, the management terminal may have a management function in addition to performing operations similar to the modeling analysis method performed by the user terminal. For example, when the user terminal acquires node information and generates a corresponding network diagram and a network analysis result, the operator may confirm the validity or invalidity of the information by the management terminal after conducting on-site verification. For example, the operator may maintain system data by the management terminal, manage user accounts, grant user permissions, determine version updates, etc. It is not limited in the embodiments of the present application.

In an example, similar to the user terminal, after obtaining the node information, the management terminal may send, via the mobile internet, the wireless local area network, etc., the obtained node information (for example, the position information, type information and status of the physical node and/or additional node) to a simulation analysis server to be used to construct a network model on the simulation analysis server side, and then, receive a simulation analysis result from the simulation analysis server via the mobile internet, the wireless local area network, etc., for the purpose of displaying. Of course, the specific communication method between the management terminal and the simulation analysis server is not limited in the embodiments of the present application.

In an example, similar to the user terminal, the management terminal may be automatically connected to the internet via the mobile internet, and the modeling analysis method may be automatically executed by the management terminal online in real time, which is not limited in the embodiments of the present application.

The modeling analysis method performed by the management terminal according to the embodiments of the present application has been described above, the modeling analysis method performed by a simulation analysis server according to the embodiments of the present application will be further described below. This method corresponds to the method in the above embodiments. For brevity of the description, only a brief description is given below. For details, please refer to the modeling analysis method in the above embodiments.

The modeling analysis method for a device management network according to the embodiments of the present application may be applied to a simulation analysis server. The modeling analysis method applied to the simulation analysis server is similar to the modeling analysis method described in the above embodiments. Based on the foregoing description, the modeling analysis method further includes: generating a simulation analysis result in response to receiving request data.

In an example, in response to the simulation analysis server receiving request data (for example, power outage analysis, power tracking, etc.) from the user terminal or the management terminal, a simulation analysis result is generated and sent to the user terminal or the management terminal, to be checked by the user.

In an example, the simulation analysis server may receive position information, type information, and status information of a physical node from the user terminal, so as to construct a network model on the simulation analysis server side, and send the simulation analysis result generated on the simulation analysis server side to the user terminal.

In an example, receiving position information, type information, and status information of a physical node from the user terminal may include: receiving the position information, type information, and status information of the physical node from the user terminal via the mobile internet. Sending the simulation analysis result to the user terminal may include: sending the simulation analysis result to the user terminal via the mobile internet. It should be noted that the communication method between the user terminal and the simulation analysis server is not specifically limited in the embodiments of the present application.

In an example, the modeling analysis method applied to the simulation analysis server may further include: in response to receiving information about an additional node, constructing an additional layer model based on the information about the additional node, the additional layer model being used to extend the network model. For the description of the operation of constructing the additional layer model, please refer to the relevant description of step S320, which will not be repeated here.

An embodiment of the present application further provides a modeling analysis method applied to a power grid management system. The method includes the following steps.

S510: acquiring position information, type information, and status information of a power grid device by a user terminal.

For the process of acquiring information by the user terminal, please refer to the description in the above embodiments.

S520: automatically constructing, based on the position information and type information of the power grid device, and in accordance with a first predetermined rule, a physical layer model to automatically form a line between power grid devices, and automatically displaying, by using an electronic map as the background, the power grid devices and the line between the power grid devices at a corresponding position.

S530: automatically constructing, based on the type information and status information of the power grid device, and in accordance with a second predetermined rule, a logical layer model to construct a network model.

S540: displaying, in response to a power outage analysis function in a scene interface being triggered, a power outage analysis result.

In an example, the operations of step S510 to step S530 may be the same as or similar to the above-mentioned step S110 to step S130, respectively. For the description of these operations, please refer to the relevant description of step S110 to step S130, which will not be repeated here.

In an example, the power grid diagram obtained by power grid modeling using the modeling analysis method may have functions such as fault position, power supply range analysis, and power outage information transmission.

In an example, the user terminal (for example, a mobile phone) may be automatically connected to the internet via the mobile internet, and the modeling analysis method applied to the power grid management system may be automatically executed by the user terminal online in real time, which is not limited in the embodiments of the present application.

Figure 10:
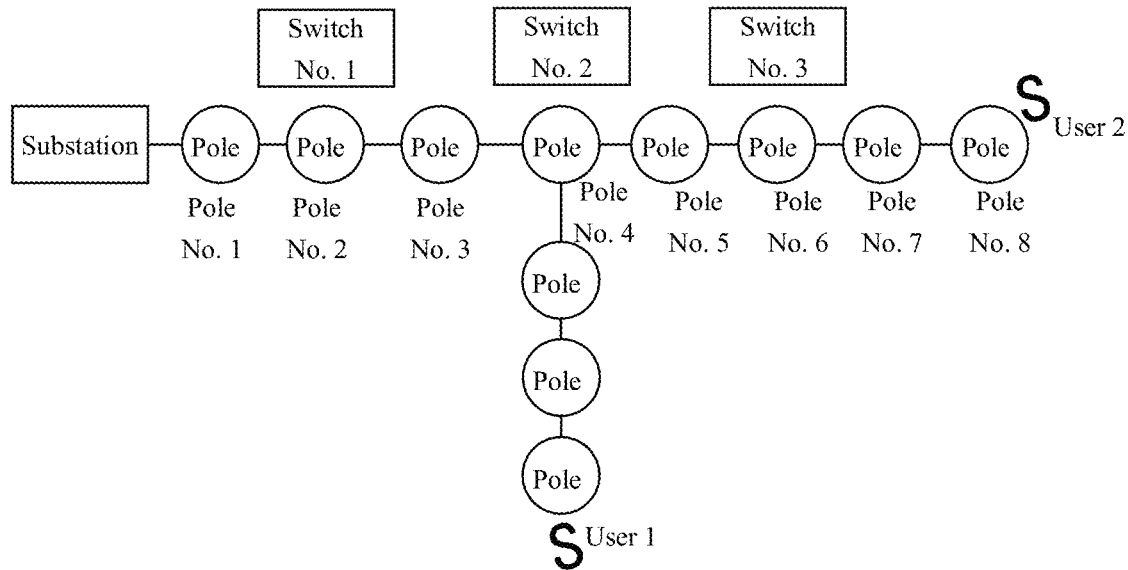
FIG. 10 is a schematic diagram of power grid fault position according to an exemplary embodiment of the present application.

FIG. 10 is a schematic diagram of power grid fault position according to an embodiment of the present application. In one example, by the modeling analysis method, after a user acquires information about power grid devices along a route by a mobile phone, a power grid model is constructed based on the acquired information about the power grid devices. For example, by the power tracking function, the intersection of the faulty points may be analyzed, i.e., the faulty power supply point. As shown in FIG. 10, after receiving the power outage information from a user 1 and a user 2, it is found that the intersection of the upper-level power supplies is at the switch 2, so the switch 2 is the faulty power supply point. In this case, after turning off the switch 2 by the power grid company, the line from the substation to the switch 2 can resume normal power supply. In an example, it may be determined by additional devices (for example, power grid monitoring devices, image monitoring devices, etc.) that the lines, on which the user 1 and the user 2 are located, are out of power, thereby confirming that the intersection of the upper-level power supplies is at the switch 2, so the switch 2 is the faulty power supply point.

An embodiment of the present application provides an operating range analysis method according to the above modeling analysis method, including: analyzing an operating line corresponding to the first node in a device management network (network model); and automatically connecting end nodes of the operating line, and forming, in accordance with a predetermined rule and on the electronic map, a closed region corresponding to the first node, the closed region being an operating range corresponding to the first node.

Specifically, taking the power grid management system as an example, after constructing a power grid model (a network model composed of physical nodes and lines) by the modeling analysis method, the operating range of a certain power grid device (i.e., physical node) in the power grid model may be analyzed, i.e., the power supply range analysis.

Figure 11:
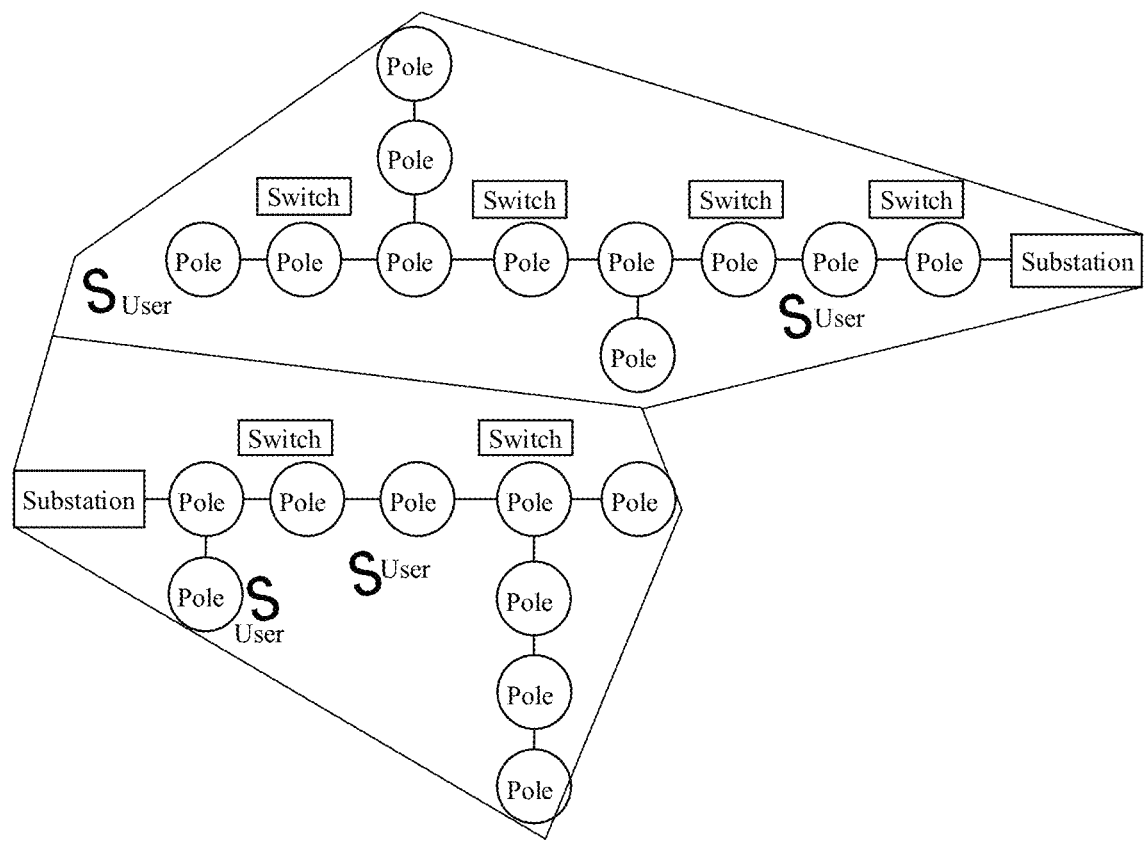
FIG. 11 is a diagram of power supply range analysis according to an exemplary embodiment of the present application.

FIG. 11 is a diagram of power supply range analysis according to an embodiment of the present application. As shown in FIG. 11, after the power grid model is established, for the power supply range analysis function, for example, first, the line for power supply from the power supply point (for example, the substation) is analyzed, that is, the operating line. The nodes at the ends are connected to form the power supply range of this line. For example, the distance from the most distant node is the power supply distance of this line, and the system can automatically accumulate the length of sections of this line, i.e., the total length of this line. In practice, the connection of nodes at the ends is usually carried out along the road on the electronic map. For example, the region between two lines may be divided in accordance with a predetermined rule (for example, a third predetermined rule). For example, the third predetermined rule may be defined as: connecting intermediate points between adjacent devices on different operating lines to form a line as a region boundary, thereby forming a complete power supply region for each line. It should be noted that the third predetermined rule may be set based on experience, actual needs, etc., which is not specifically limited in the embodiments of the present application.

In the example shown in FIG. 11, the respective power supply regions are formed by the operating lines to which the two substations belong. For example, first, the respective operating lines of the two substations are analyzed; then, closed regions with independent operating lines may be formed, by automatically connecting nodes at the ends of the respective operating lines, and in accordance with the third predetermined rule, for example, by taking the common center line of the devices as the boundary in the middle part of the two lines. The closed regions are the respective power supply ranges of the two substations.

In an example, in response to the analysis function in the user interface being triggered, the analysis result of the power supply range may be displayed on the client.

The operating range analysis method further includes: sending information to users within the operating range corresponding to the physical node (for example, the first node), the information including at least a picture and a text. In an example, when the power supply bureau in a certain place plans to repair a certain power grid device next week, information including both pictures and texts may be sent in advance to users within the operating range corresponding to the power grid device. For example, the information includes, but is not limited to, name of the device to be repaired, images of the device, images of the affected region, estimated repair time, etc.

In an example, when the fault of a certain physical node (for example, a certain power grid device) is detected, fault information may be sent to users within the operating range corresponding to the physical node. For example, the fault information includes, but is not limited to, the cause of the fault, the range of the fault (for example, map images corresponding to the range of the fault), estimated fault handling time, and name of the faulty line, etc.

In an example, for the power outage situation in FIG. 10, by the electronic map within the power supply range of the switch 2, power outage information including both pictures and texts may be sent to users in the region by means of WeChat or the like. For example, the power outage information may include the type of the fault (for example, substation fault, switch fault, etc.), power outage line, images of the power outage region, estimated power outage time, etc., to alleviate the anxiety of users.

In an embodiment of the present application, sending information to users within the operating range corresponding to the physical node may include: sending information to individual users or enterprise users within the operating range. In an example, information may be sent to the user terminal, the management terminal, etc., via the mobile internet, the wireless local area network, etc. For example, the user terminal, the management terminal, etc., can display the information on a display screen for the user to quickly check the information. The information includes at least pictures and texts. For example, it may be sent to the users in the form of MMS, WeChat, email, etc., which is not specifically limited in the embodiments of the present application.

It should be noted that the device operating range analysis method may be applied to a power grid management system, a water pipeline network management system, a gas pipeline network management system, etc., which is not specifically limited in the embodiments of the present application. In an example, when a water pipe fault (for example, water pipe burst, etc.) is detected, by the device operating range analysis method, water outage information including both pictures and texts, for example, water outage time, cause of water outage, and range of water outage, etc., may be sent to users within the water supply range of the faulty water pipe, that is, users who are out of water. In this way, the current situation that municipal companies such as the power grid company, the water supply company, and the natural gas company can release only text-based fault information can be solved.

In an example, the user terminal (for example, a mobile phone) may be automatically connected to the internet via the mobile internet, and the device operating range analysis method may be automatically executed by the user terminal online in real time, which is not limited in the embodiments of the present application.

An embodiment of the present application further provides a network model update method. It should be noted that the network model update method can support distributed concurrent access and the merging of network diagrams. It should also be noted that the network model update method may be applied to power grid management models, water pipeline network management models, gas pipeline network management models, etc., and may also be applied to other data management models such as road network models (for example, for Baidu Map, Google Map, etc.), meteorological data management models, etc. which is not limited in the embodiments of the present application. The network model update method may include the following steps.

S610: dividing an electronic map into multiple regions.

In one example, in order to facilitate rapid network modeling of a new region, the electronic map is divided into multiple regions according to grids or administrative boundaries.

S620: during a network update process, when node information for different contents of a same region is received from multiple user terminals, generating a corresponding network model for each of the multiple user terminals to form multiple network models.

In an example, multiple registered users may acquire data of a same region (for example, a same line, a same cell, etc.) at the same time, and simultaneous submission is supported. For example, the data submitted by each registered user may form, on the simulation analysis server, an independent submitted layer named by an independent version number.

In an example, a corresponding network model may be generated for each user terminal, based on the data submitted by each user terminal, by the modeling analysis method according to the embodiments of the present application. It should be noted that a corresponding network model may be generated for each user terminal, based on the data submitted by each user terminal, by other conventional modeling methods. The modeling method is not specifically limited in the embodiments of the present application.

S630: selecting, based on a first predetermined condition, a network model from the multiple network models, and saving it as a layer to serve as a submitted layer corresponding to a current moment.

In an example, the first predetermined condition may include at least one of the following: the network model has the largest number of physical nodes (for example, has the largest number of devices) in a plurality of network models; the network model has the largest map area in a plurality of network models; the network model has the longest map line in a plurality of network models; and the network model has the most types of physical nodes in a plurality of network models. For example, the first predetermined condition may be that the network model has the largest map area and the largest number of physical nodes in a plurality of network models. Of course, the first predetermined condition may be set according to actual needs, which is not limited in the embodiments of the present application.

S640: when the number of saved submitted layers reaches a threshold, or after a predetermined amount of time has elapsed since a first submitted layer, selecting, based on a second predetermined condition, a submitted layer from the multiple submitted layers as a time layer for use in updating a network model.

In an example, similar to the first predetermined condition, the second predetermined condition may include at least one of the following: the network model has the largest number of physical nodes (for example, has the largest number of devices) in a plurality of network models; the network model has the largest map area in a plurality of network models; the network model has the longest map line in a plurality of network models; and the network model has the most types of physical nodes in a plurality of network models. Of course, the second predetermined condition may be set according to actual needs, which is not limited in the embodiments of the present application.

Taking power grid modeling as an example, the time layer version may be displayed on the power grid diagram, and compared with the existing layer version by displaying them in different colors. For example, the determined time layer version is updated as the official power grid model version.

In an example, any registered user can evaluate the correctness of the existing power grid data by marking on the power grid diagram or submitting a layer version. It is convenient for system maintenance personnel to perform on-site verification. For the data verified to be valid, the system administrator can update part of the devices on the user terminal or the management terminal.

In an embodiment, in order to facilitate the rapid modeling of a power grid in a new area, a modeling method (or a network model update method) is proposed, which divides an electronic map into multiple regions according to grids, administrative boundaries or the like, and supports distributed concurrent access and the merging of power grid diagrams. In the modeling process using this modeling method, there are multiple layers including submitted layers and time layers. In other words, the power grid includes multiple layers including submitted layers and time layers. The submitted layers support (or correspond to) power grid information acquired by multiple user terminals. The time layers are saved according to the update time of the power grid, and support the reproduction of historical power grids. In this embodiment, multiple registered users may acquire data of a same line at the same time, and simultaneous submission is supported. The data submitted by each registered user may form, on a server, an independent submitted layer named by an independent version number, and a power grid model is established base on the submitted layers according to a preset rule (for example, a first predetermined condition). Specifically, in this embodiment, a preset rule for comparing submitted layer versions is defined, for example, a submitted layer version has the largest number of devices in the multiple submitted layer versions. Further, The update of the layer has a certain period. Specifically, when the number of submitted layer versions submitted from multiple registered users reaches a threshold, or after a predetermined amount of time has elapsed since a first submitted layer version was submitted, the layer versions are compared according to a preset rule (for example, a second predetermined condition). Specifically, it may be to compare a new layer version with another new layer version (for example, compare each two of the submitted layer versions), or may be to compare the new layer version(s) with the existing layer version. A comparison result is determined as the final power grid layer version, which is automatically named as time layer by the time and is submitted again. Specifically, the time layer version to be submitted may be displayed on the power grid through a user terminal, and may be compared with the existing layer version in different colors or display methods, which is convenient to the reproduction of historical power grid, and to display the difference between the time layer version to be submitted and the historical power grid. The determined time layer version is used as the official power grid model version by updating.

It should be noted that the content of the submitted layer is not limited in size. It may be a section of line, or part of the devices. As long as it is confirmed to be valid, it may be converted into a time layer for official submission.

In the embodiments of the present application, two methods are provided for updating a network model, one method is to mark on the diagram (such as a power grid diagram), and the other method is to submit a layer version.

The Update of a network model by using the method of submitting a layer version has a certain period, and the update mechanism is triggered when one of the following two conditions is met: the updated layer versions received reaches a certain number; although it does not reach the upper limit of the number of updated layer versions, it reaches a certain time requirement, such as 24 hours or a week, the update mechanism is also triggered.

The method of marking on the diagram to update a network model may include: receiving marking information sent by a user terminal; and displaying the marking information on a current layer of the network model.

For a special situation of a certain actual position corresponding to a position on the electronic map, a user may input the marking information to the user terminal, and the marking information represents the special situation at the actual position. The marking information may be a text and/or a picture.

The Update of a network model by using the method of marking on the diagram is timely. For example, when a user finds that a manhole cover is missing on the road (a special situation of a certain actual position), the user can mark on the existing layer (or currently layer) or mark on a new transparent temporary layer, to remind the users of the network model to pay attention to the dangerous factors on the road by means of a third-party reference. Specifically, the user may input the marking information about the missing manhole cover to the user terminal, the marking information may be marked on the existing layer or marked on a new transparent temporary layer, and thus the marking information may be displayed on the diagram immediately. Alternatively, a user may immediately mark on the diagram when the user finds that a wire is broken, specifically the user may input the marking information about the broken wire to a user terminal, the marking information may be marked on the existing layer or marked on a new transparent temporary layer, and thus the marking information may be displayed on the diagram immediately.

This kind of marking is reference, with the characteristics of timeliness, unofficial and unauthoritative, and does not affect the logical connection of the current network, unless this kind of marking is added as a change to the updated layer version, after submission and confirmation, the marking information obtained by this kind of marking is updated to the final official layer version.

In an embodiment, the method of marking on the diagram to update a network model may further include: receiving attribute information sent by the user terminal. The attribute information is hidden information, which includes the name of the user who marks the marking information on the diagram, and the marking time. The attribute information is usually not displayed, but is displayed when a user clicks the mark information or the trigger button on the diagram.

In the embodiments of the present application, the network model may include a road network model, which is not limited in the embodiments of the present application.

In an example, the network model update method may be executed on the server side. In an example, the user terminal (for example, a mobile phone) may be automatically connected to the internet via the mobile internet, and the network model update method may be automatically executed by the user terminal online in real time, which is not limited in the embodiments of the present application.

Therefore, by the network model update method based on the modeling analysis method according to the embodiments of the present application, the concurrent data acquisition by multiple persons can be effectively handled and a network model update method is provided.

The embodiments of the present application further provide a modeling analysis method based on geographic targets, including: using predetermined targets at related geographic positions as nodes of a network model; acquiring position information of the nodes by means of the mobile client and carrying out classification; and establishing a connection relationship between the nodes representing the geographic positions and the network model according to an established rule. Geographic targets refer to objects that can be managed through the network, such as switches, transformers, telecommunications base station equipment, water pipe valves and various users in the power grid.

In an embodiment, the modeling analysis method based on geographic targets includes the following steps.
1) Defining network connection rules by using geographically predetermined targets as nodes of a network model;
2) Acquiring position information of the nodes by means of a mobile client and carrying out classification;
3) Receiving the information from the mobile client, and displaying the geographic positions of the targets on an electronic map;
4) Establishing a connection relationship between the nodes representing the geographic positions and the network model according to an established rule (predetermined rule).

Figure 12:
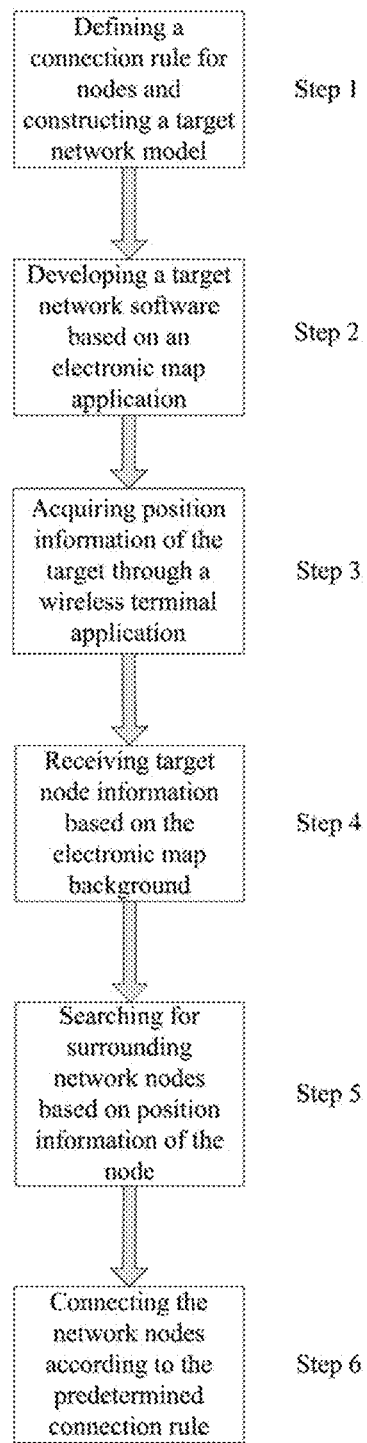
FIG. 12 is a schematic flowchart of a modeling analysis method for a device management network according to another exemplary embodiment of the present application.

Referring to FIG. 12, FIG. 12 is a schematic flowchart of a modeling analysis method for a device management network according to another exemplary embodiment of the present application. The method includes the following steps.

Step 1: defining a connection rule for nodes and constructing a target network model.
1) Content: using geographically predetermined targets as the nodes of the network model, defining a connection rule, and constructing network model.
2) Specific approach: a rule-driven device management modeling method similar to that of Intergraph Corporation is adopted. For the target management network to be established, first listing the types of targets involved in the network, and then defining the targets as nodes of the network, and defining a connection rule of the various types of nodes in the network, finally connecting the nodes with lines according to the rule to complete the construction of the target management network model.

Step 2: developing a target network software based on an electronic map application.
1) Content: developing a network target management system based on an electronic map and rule connections.
2) Specific approach: based on a rule-driven device management modeling method similar to that of Intergraph Corporation, developing a network software which uses an electronic map as the background and is based on cloud storage and cloud computing to prepare for the application of the network management model.

Step 3: acquiring position information of the targets through a wireless terminal application.
1) Content: developing data acquisition client based on position acquisition technology of a wireless terminal.
2) Specific approach: developing mobile client application based on wireless positioning acquisition technology to acquire geographic position information of target nodes.

Step 4: receiving target node information based on the electronic map background.
1) Content: receiving client information and displaying the position of the target node on the electronic map.
2) Specific approach: receiving target node information (including node position coordinates, node types, etc.) sent by the client in the cloud, and using the electronic map as the background to display the node information on the cloud electronic map.

Step 5: searching for surrounding network nodes based on the position information of the node.
1) Content: searching for information of other network nodes around the present node on the electronic map.
2) Specific approach: on the electronic map, taking the geographic position of the present node as a center and searching for nodes information of the adjacent network around the target according to the predetermined connection rule.

Step 6: connecting the network nodes according to the predetermined connection rule.
1) Content: connecting the present node to the searched network nodes according to the predetermined connection rule.
2) Specific approach: based on the position of the node and the type of the node displayed on the electronic map, connecting the present node and the adjacent nodes in the network according to the predetermined rule, so that the node joins the network to be a part of the network model.

Figure 13:
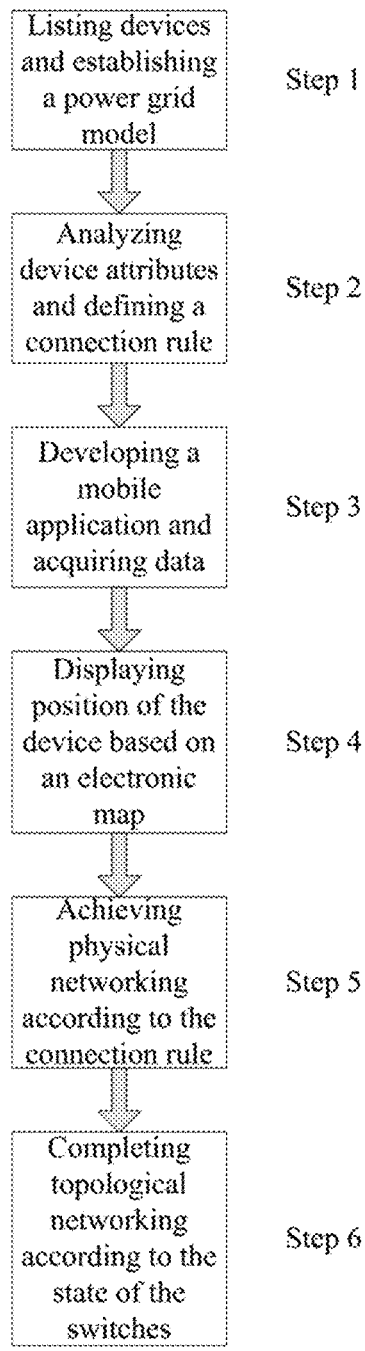
FIG. 13 is a schematic diagram of network modeling of a power grid management system according to an exemplary embodiment of the present application.

Embodiments (I) Application for Network Modeling of a Power Grid Management System As an essential part of urban management, a good power grid management system is an important guarantee of the power supply. A power grid is an important medium for power companies to supply power to users. Through an efficient power grid management system, the power companies can provide users with high-quality and reliable power services. A complete power grid management system not only includes various types of power grid device, but also contains user information that changes constantly. How to rapidly complete the establishment of a power grid management system is an important embodiment of the present application. (FIG. 13: a schematic diagram of network modeling of a power grid management system)

Step 1

1. Content: making a list of devices and establishing a power grid model.
2. Specific approach:
1) Making a list of devices involved in the power grid system, such as targets like substations, ring main units, public transformers, switches etc., and large, medium and small users and the like;
2) Developing rule-driven device management application similar to that of Intergraph Corporation. This software is big data cloud application using electronic maps as background. In the software, various types of devices and users are defined as network nodes, and the nodes are connected by lines to form a management network for power grid targets.

Step 2

Figure 14:
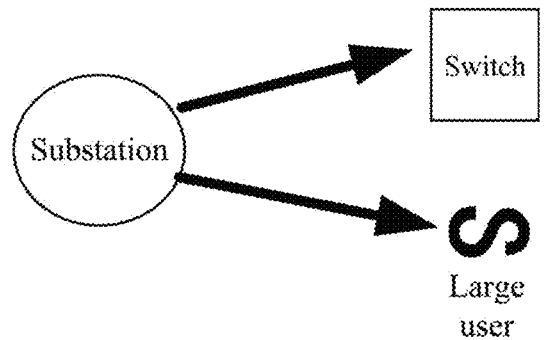
FIG. 14 is a schematic diagram of connection attributes of a substation.
Figure 15:
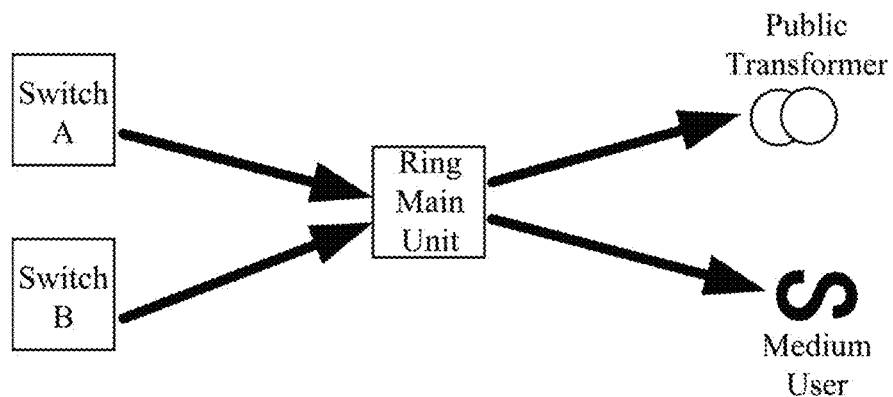
FIG. 15 is a schematic diagram of connection attributes of a ring main unit.
Figure 16:
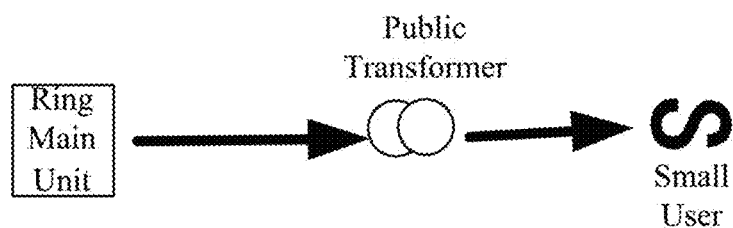
FIG. 16 is a schematic diagram of connection attributes of a public transformer.
Figure 17:
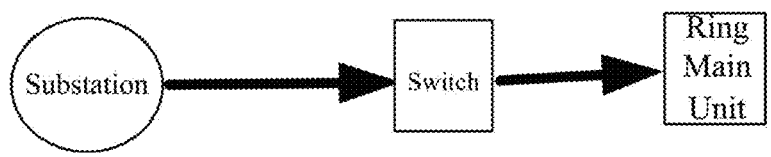
FIG. 17 is a schematic diagram of connection attributes of a switch.
Figure 18:
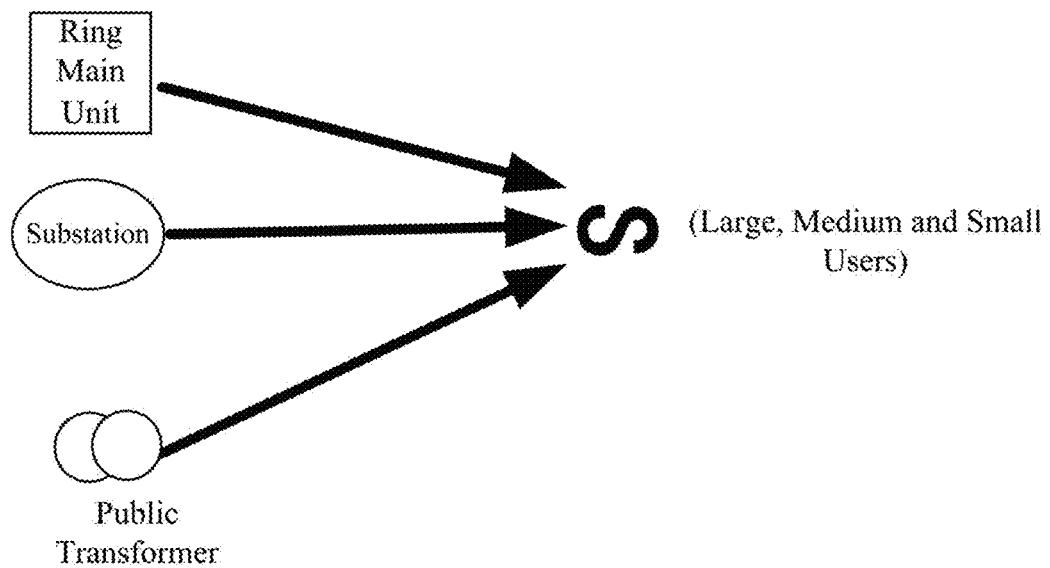
FIG. 18 is a schematic diagram of connection attributes of users.

1. Content: analyzing device attributes and defining a connection rule.
2. Specific approach: during the development of the cloud software, the topological connection rule of different types of nodes in the network is defined in advance according to different states of the various devices when the power grid is in operation in the reality. For example, a substation as a power supply point can supply power to switches and large users (FIG. 14: a schematic diagram of the connection attributes of a substation); a ring main unit as a device in the line supplies power to medium users and public transformers, and its power can be supplied from different switches (FIG. 15: a schematic diagram of the connection attributes of the ring main unit); a public transformer as a device at the terminal of the line supplies power to small users such as residents, and its upper-level power supply is from the ring main unit (FIG. 16: a schematic diagram of connection attributes of a public transformer); a switch as a device in the line can be connected to the substation and the ring main unit. Whether the switch is open or closed directly affects the power supply area of the power supply in the line and plays a decisive role in the change of the topological connection relationship of the devices in the network (FIG. 17: a schematic diagram of switch connection attributes); similarly, according to the amount of electricity consumed by the electrical devices of the users, their power is supplied from the substation, the ring main unit and the public transformer respectively (FIG. 18: a schematic diagram of user connection attributes).

Step 3

Figure 19:
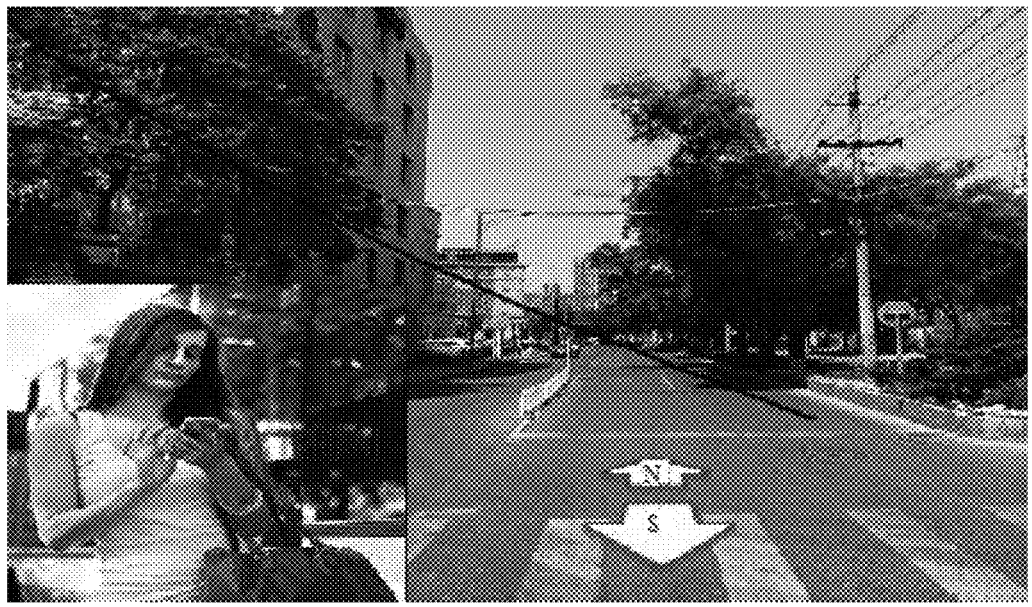
FIG. 19 is a schematic diagram of acquisition of device data based on WeChat application on a mobile phone.

1. Content: developing a mobile application and acquiring data.
2. Specific approach:
1) Developing a mobile client application based on data acquisition in order to facilitate the classification of the position information of the acquired devices;

2) Starting from the substation, acquiring the geographic position information of the substation, the ring main unit, the public transformer, the switch and various users along the path of the line, and sending the information through the clients (FIG. 19: a schematic diagram of acquisition of device data based on a mobile client application).

Step 4

Figure 20:
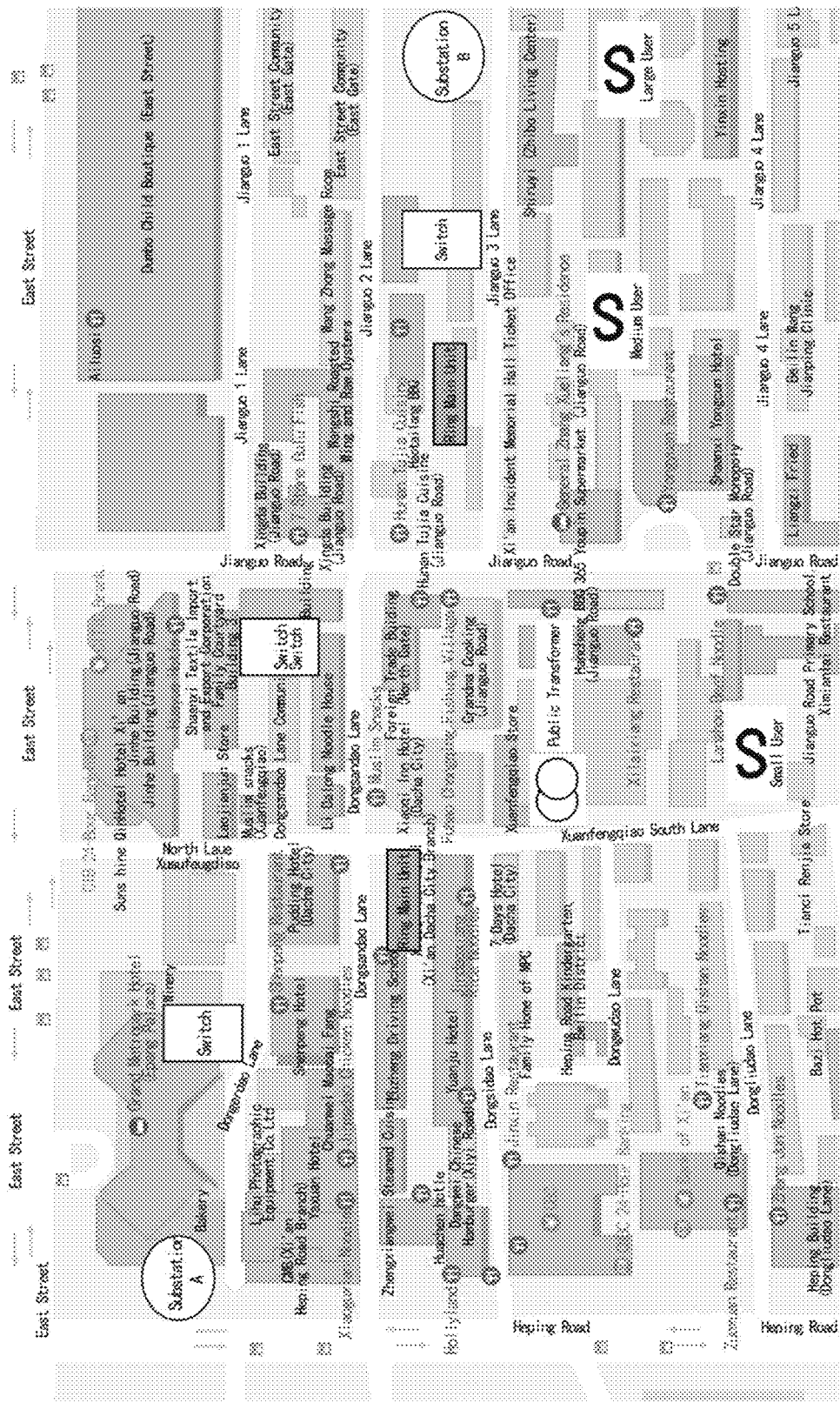
FIG. 20 is a schematic diagram of devices positions based on an electronic map.

1. Content: displaying position of the device based on an electronic map.
2. Specific approach: receiving data sent by mobile clients in the cloud, according to the distribution of the power grid on the streets, considering users as devices in the power grid and displaying the position of different devices and various users in the power grid model on the electronic map, so that the information of devices in the grid and users can be displayed intuitively on the map (FIG. 20: a schematic diagram of device position based on an electronic map).

Step 5

Figure 21:
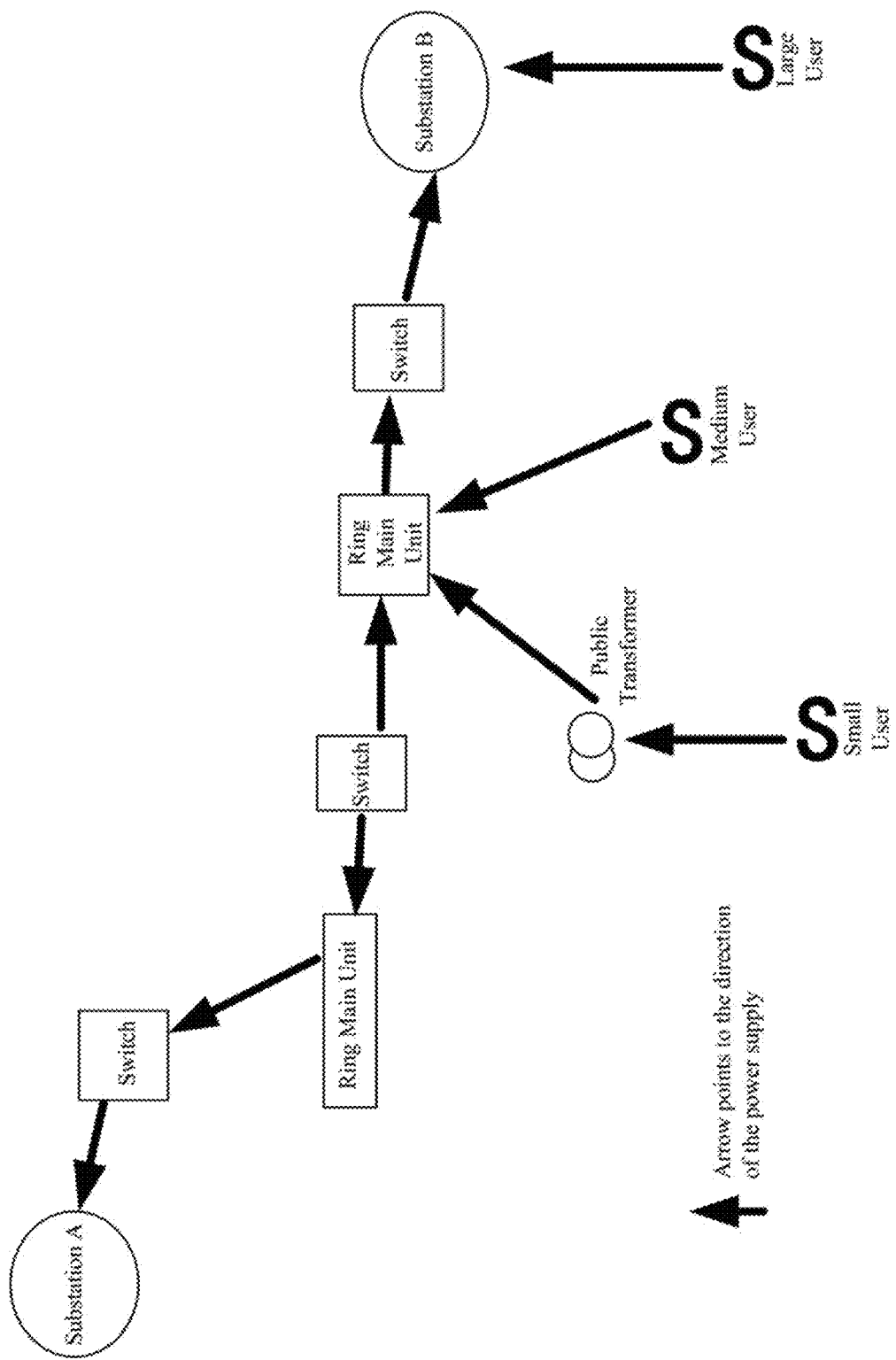
FIG. 21 is a schematic diagram of connection of devices based on rule networking.

1. Content: achieving physical networking according to the connection rule.
2. Specific approach:
1) In the cloud software, searching information of surrounding devices according to the positions of different devices and various users displayed on the electronic map;
2) According to the different types of devices and the established connection rule, a physical connection between the geographic position of the device and the upper-level power supply point is made. That is: switches and large users can be connected to substations; public transformers and medium users can be connected to ring main units; small users such as residents can be connected to public transformers. The automatic connection of the devices mainly depends on the topological relation set by the rule, and is not related to the line connecting the devices (FIG. 21: a schematic diagram of connection of devices based on rule networking).

Step 6

Figure 22:
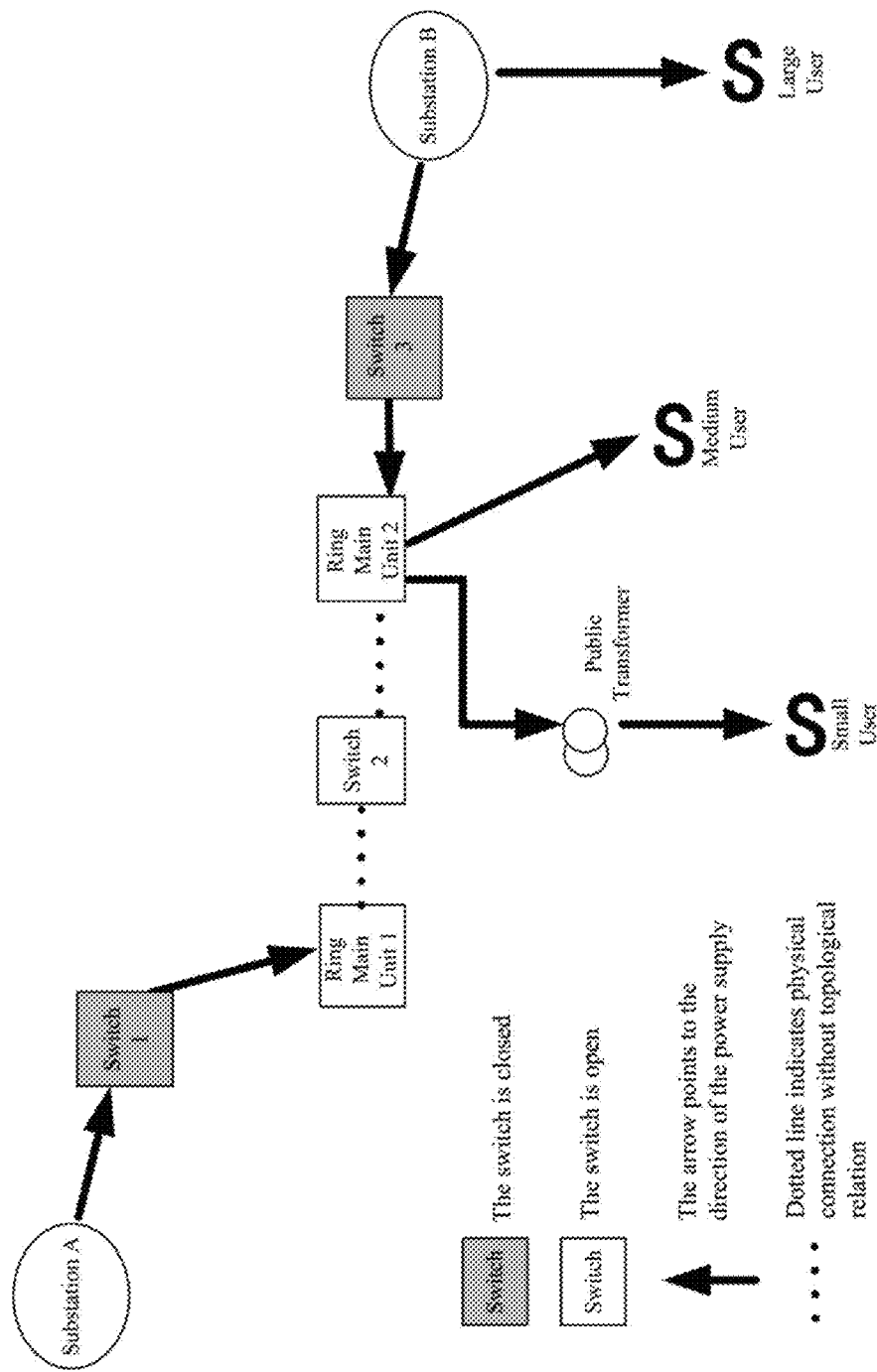
FIG. 22 is a schematic diagram of a topological connection of a network in a normal operation mode.
Figure 23:
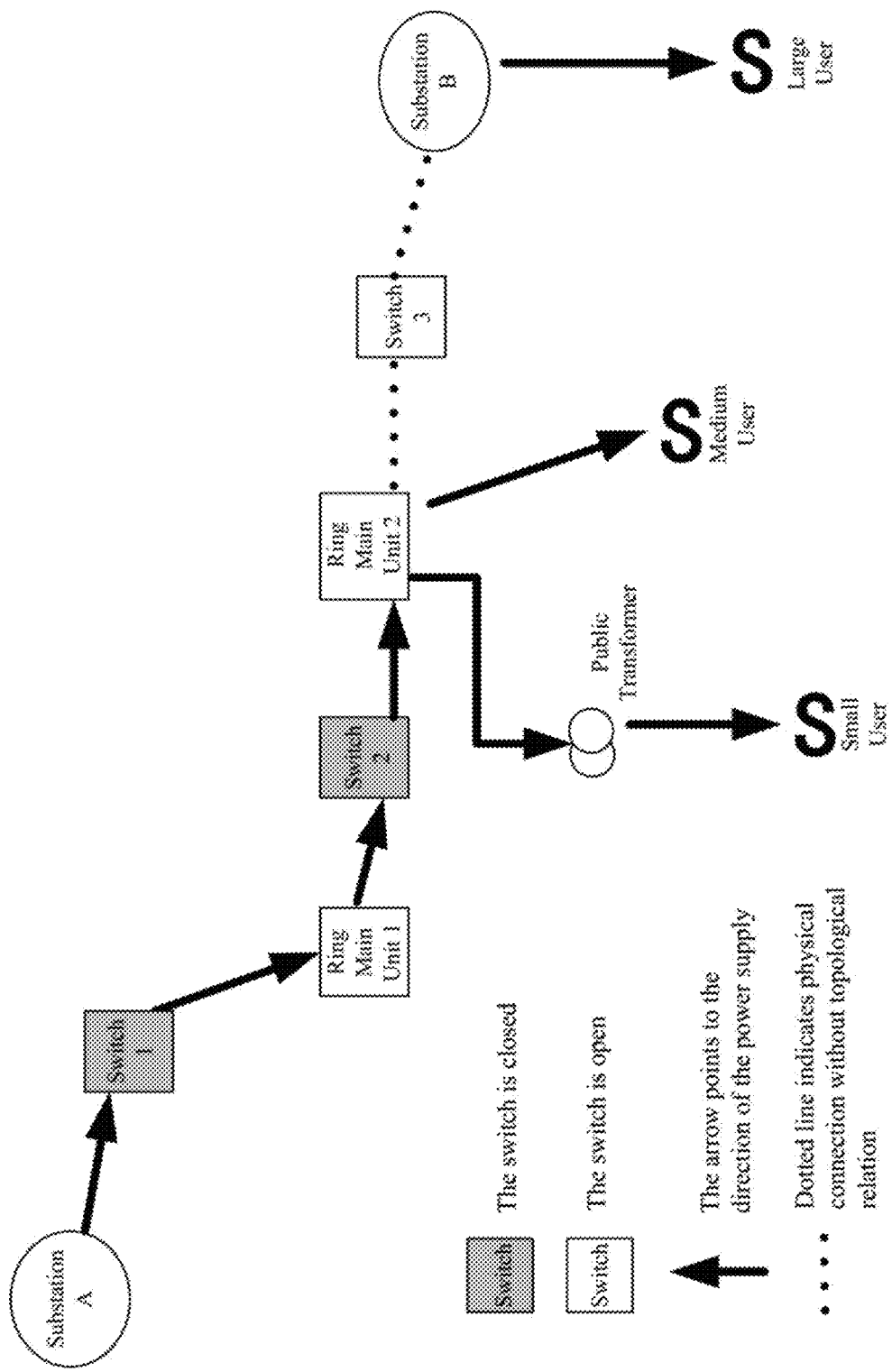
FIG. 23 is a schematic diagram of a topological connection of the network after a change in the operation mode.

1. Content: completing topological networking according to the state of the switches.
2. Specific approach:
1) In the cloud software based on the electronic map, determining the topological relation between adjacent devices in the network according to the different operating states of on and off of the switches;
2) According to the types of different nodes such as substations, ring main units, public transformers, switches and large, medium and small users and the current direction of their power supply device, checking the network connection with the lower-level power supply device to ensure the correct topological relation so as to complete the establishment of the entire network system.
3) The spatial positions of lines, devices and users in the power grid are closely related to the electronic map; the physical connection between network nodes is closely related to the established connection rule; the topological connection relationship between network nodes is closely related to the connecting state of the switches; the line connection between the nodes is only used for spatial connection, and has no direct impact on the topological relation between the nodes (FIG. 22: a schematic diagram of a topological connection of a network in a normal operation mode). In FIG. 22, in the normal operation mode of the power grid, switches 1 and 3 are closed, and switch 2 is open. The dotted lines on both sides of switch 2 only indicate that switch 2 and ring main units 1 and 2 are only physically connected without topological relation, and the lines represented by the dotted lines have no electricity. The upper-level nodes of ring main units 1 and 2 come from switches 1 and 3, respectively, and their power supplies come from substation A and substation B, respectively.
4) The change of the connecting state of the switches in the network will determine the operating state of the entire network and directly affect the topological connection relationship between each node in the network. That is, the change of the connecting state of the switches will affect the power supply range of the substation on the power supply side, and directly affect the direction of power supply of related targets, resulting in a change in the topological relation of the upper and lower target nodes (FIG. 23: a schematic diagram of a topological connection of the network after a change in operation mode). In FIG. 23, the operation mode of the power grid is changed. Switches 1 and 2 are closed, and switch 3 is open, and the power supply ranges of substations A and B are changed. The upper-level node of the ring main unit 2 is changed from switch 3 to switch 2, and its power supply is changed from substation B to substation A. Changes occurred in the operating state of the entire network as well as in the topological relation between ring main unit 2 and its upper-level node.

(II) Application for a Power Outage Management System for Users

Figure 24:
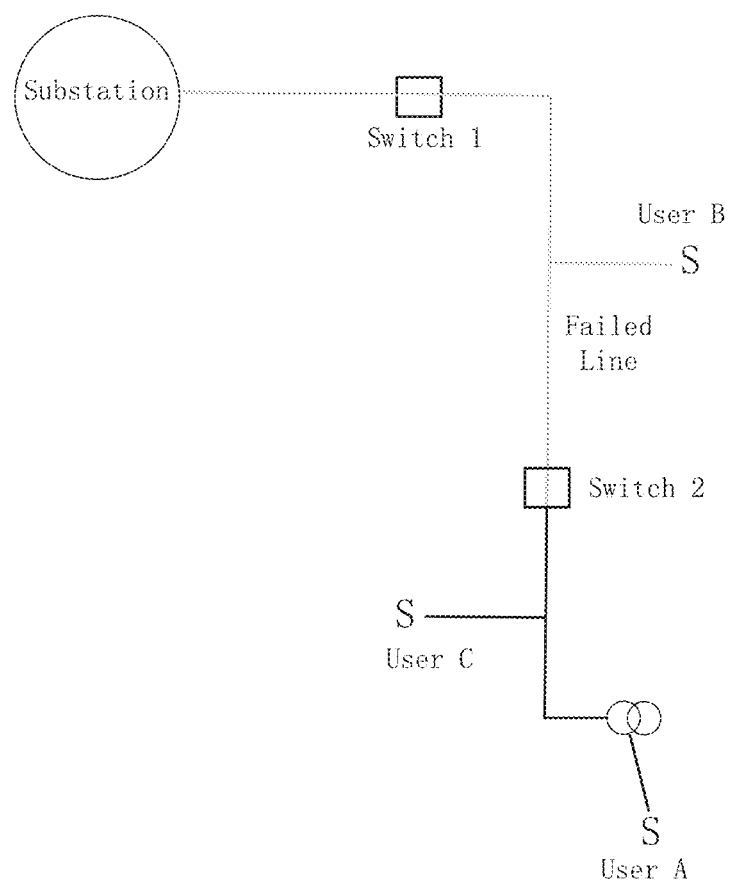
FIG. 24 is a schematic diagram of a user inquiry during a power outage.
Figure 25:
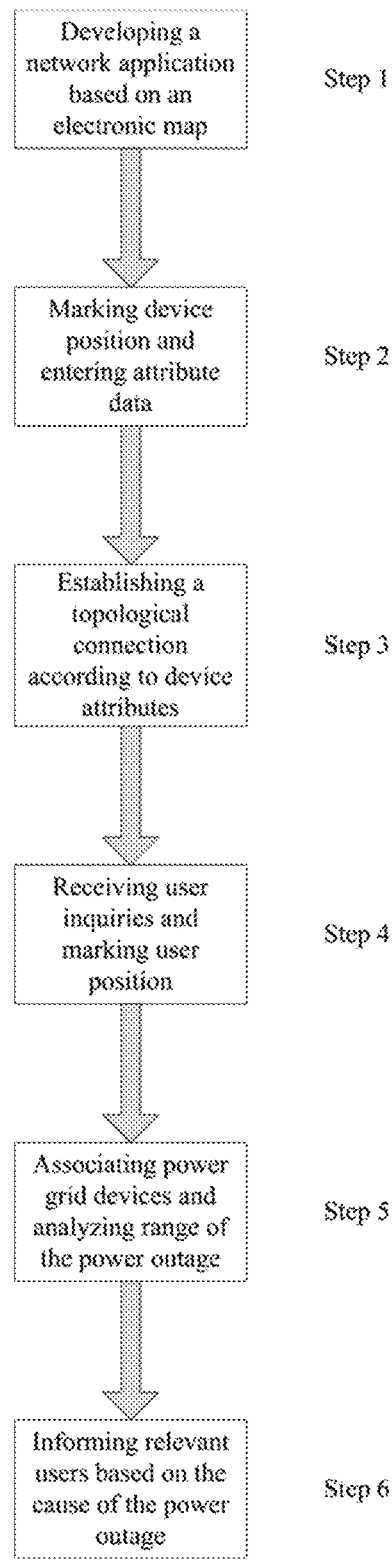
FIG. 25 is a schematic diagram of a power outage handling system for users.

Demand on the power supply has been raised with the improvement in people's living standards. Finding out the outage range and informing relevant users in time by quickly positioning may undoubtedly show high-quality services (FIG. 24: a schematic diagram of outage inquiries from users). The application in the present disclosure may greatly improve the efficiency of information determination and notification of a power outage, which is advantageous to the improvement of service. The relevant steps are as follows (FIG. 25: a schematic diagram of a power outage handling system for users).

Step 1

1. Content: developing a network application based on an electronic map.
2. Specific approach: developing power grid management software based on an application of geographic information system similar to that of Intergraph and ESRI Corporation. The software uses a device as a network node in the power grid management system and is a network management application based on an electronic map.

Step 2

1. Content: marking the position of the device and entering attribute data.

2. Specific approach: when the power grid management software is applied, the geographic position of the device in the grid can be marked directly on the electronic map, and relevant information of the device is inputted.

Step 3

1. Content: establishing a topological connection according to device attributes.
2. Specific approach: classifying the devices, and connecting the devices on the map with lines according to the attributes and operating states of the devices, and establishing a topological relation.

Step 4

1. Content: receiving user inquiries and marking user position.
2. Specific approach: receiving inquiries of power outage information from users by telephone or WeChat, etc., and at the same time, displaying position information of users on the electronic map.

Step 5

1. Content: associating power grid devices and analyzing the range of the outage.
2. Specific approach:
1) Associating the user with the surrounding power grid devices according to the user's position;
2) Carrying out classification and analysis of power outage for the user according to power supply situation of the power grid devices;
3) In FIG. 24, power supply of user A is from a public transformer, power supply of user C is from switch 2, and user B has no power outage information;
4) According to the analysis of the power outage situation of the users, it can be determined that the failed power supply is all the lines supplied by switch 2. Therefore, all blocks involved in the lines related to switch 2 are within the range of this outage.

Step 6

1. Content: combining the causes of the power outage and informing relevant users.
2. Specific approach: according to the analysis results, the range of the power outage can be quickly determined, and related users including A and C can be informed immediately in accordance with the maintenance plan or fault repairing situation, so that a quickly response to the power outage area may be achieved.

Compared with the prior art, the modeling analysis method according to the embodiments of the present application has the following advantages and effects.

1. According to distribution characteristics of the map targets relying on the geographical environment, the present application combines the network model based on the connection rule, the electronic map application based on space management, and the data positioning and acquiring technology based on mobile clients. Geographically predetermined targets are used as nodes of a network model, and the position information of the nodes is acquired by means of the mobile client, so that a connection is established between the nodes representing the geographic positions and the network model according to a predetermined rule, thereby completing the network establishment efficiently.
2. Compared with the existing methods, by applying the method of the present application, the data acquisition of predetermined targets around a road may be completed through the mobile terminal when moving along the road, and the establishment and analysis of the network model of the target management system based on the electronic map may be completed rapidly. This method greatly improves the efficiency of data entry, which promotes the maintenance and analysis efficiency of massive data based on geographic information.
3. Since the electronic map is mainly used as the display background of the target management network, it does not affect the topology of the network. Therefore, it is not necessary to use a special measuring tool for high-precision on-site positioning. The position information obtained through the positioning technology of the mobile terminal can fully meet the requirements of management and display, reducing the investment of special measuring tools and training time, thereby saving significant human and financial resources.
4. For the target management network, virtually displaying the geographic position of the targets on the electronic map according to the geographical distribution of the targets is beneficial to the macro management of the targets. According to the change of the state of the targets, the topological connection between targets is directly affected and the efficiency of network operation and analysis is improved. The combination of the two will help enhance the management of the target network based on geographic information.
5. The construction of the urban pipeline network requires the approval of the planning department. The government has first-hand detailed information, so it can entrust a third party to set up a device management network in a monopoly industry. At the same time, acquisition of information of a user's device which newly joins the network can be carried out simultaneously with the construction of the network. With the improvement of the network, the analysis results of the network operating state may come from the feedback of users, and it may not necessarily rely on the information provided by the monopoly industries such as electricity and water supply. This is helpful for the government to obtain the operating state of the municipal network as soon as possible, and improve the quality of public services and emergency response efficiency.

Therefore, in the target management network based on geographic information, the predetermined targets are used as nodes in the network, and the classification of different targets is achieved by means of the positioning of the mobile client. On the electronic map, the connections between the targets and the network are automatically completed according to the predetermined connection rule. Accordingly, the establishment of the network may be quickly completed and efficient management of the targets may be achieved.

An embodiment of the present application further provides an electronic device, for example a user terminal, including: a memory and a processor. The memory stores instructions that, when executed by the processor, enable the user terminal to execute any of modeling analysis methods according to the embodiments of the present application.

An embodiment of the present application further provides an electronic device, for example a web server, including: a memory and a processor. The memory stores instructions that, when executed by the processor, enable the web server to execute any one of the modeling analysis method, the operating range analysis method, and the network model update method according to the embodiments of the present application.

It should be noted that:
(1) the drawings of the embodiments of the present application involve only the structures involved in the embodiments of the present application, and for other structures, please refer to common designs; and
(2) the embodiments of the present application and features in the embodiments may be combined to obtain new embodiments, if not conflict.

The electronic device according to the embodiments of the present application may also include a power supply component configured to perform power management of the electronic device, wired or wireless network interface(s) configured to connect the electronic device to a network, and an input/output (I/O) interface. The electronic device may operate based on an operating system stored in the memory, such as Windows Server™ Mac OS X™. Unix™, Linux™, FreeBSD™, or the like.

A non-temporary computer readable storage medium, when instructions in the storage medium are executed by a processor of the above electronic device, cause the above electronic device to perform any one of a modeling analysis method, an operating range analysis method, and a network model update method according to the embodiments of the present application.

All the above-mentioned optional technical solutions can be combined in any way to form an optional embodiment of the present application, which will not be repeated here.

Persons skilled in the art may realize that, units and algorithm steps of examples described in combination with the embodiments disclosed here can be implemented by electronic hardware, computer software, or the combination of the two. Whether the functions are executed by hardware or software depends on particular applications and design constraint conditions of the technical solutions. Persons skilled in the art may use different methods to implement the described functions for each particular application, but it should not be considered that the implementation goes beyond the scope of the present disclosure.

It can be clearly understood by persons skilled in the art that, for the purpose of convenient and brief description, for a detailed working process of the foregoing system, device and unit, reference may be made to the corresponding process in the method embodiments, and the details are not to be described here again.

In several embodiments provided in the present application, it should be understood that the disclosed system, device, and method may be implemented in other ways. For example, the described device embodiments are merely exemplary. For example, the unit division is merely logical functional division and may be other division in actual implementation. For example, multiple units or components may be combined or integrated into another system, or some features may be ignored or not performed. Furthermore, the shown or discussed coupling or direct coupling or communication connection may be accomplished through indirect coupling or communication connection between some interfaces, devices or units, or may be electrical, mechanical, or in other forms.

Units described as separate components may be or may not be physically separated. Components shown as units may be or may not be physical units, that is, may be integrated or may be distributed to a plurality of network units. Some or all of the units may be selected to achieve the objective of the solution of the embodiment according to actual demands.

In addition, the functional units in the embodiments of the present disclosure may either be integrated in a processing module, or each be a separate physical unit; alternatively, two or more of the units are integrated in one unit.

If implemented in the form of software functional units and sold or used as an independent product, the integrated units may also be stored in a computer readable storage medium. Based on such understanding, the technical solution of the present disclosure or the part that makes contributions to the prior art, or a part of the technical solution may be substantially embodied in the form of a software product. The computer software product is stored in a storage medium, and contains several instructions to instruct computer equipment (such as, a personal computer, a server, or network equipment) to perform all or a part of steps of the method described in the embodiments of the present disclosure. The storage medium includes various media capable of storing program codes, such as, a USB flash drive, a mobile hard disk, a Read-Only Memory (ROM), a Random Access Memory (RAM), a magnetic disk or an optical disk.

It should be noted that in the description of the present application, the terms "first", "second", "third" and the like are only used for the purpose of description, and cannot be understood to indicate or imply relative importance. Further, in the description of the present application, the meaning of "a plurality" is two or more unless otherwise specified.

The above are only the preferred embodiments of the present application and are not configured to limit the scope of the present application. Any modifications, equivalent substitutions, improvements and so on made within the spirit and principle of the present application should be included within the scope of the present application.

What is claimed is:

1. A modeling analysis method for a device management network, comprising:
   acquiring position information and type information of a first node acquired by a user terminal; and
   displaying the first node on an electronic map according to the position information and the type information of the first node, and establishing, in accordance with a first predetermined rule and on the electronic map, a line connection between the first node and at least one second node displayed on the electronic map,
   wherein the modeling analysis method further comprises:
   acquiring status information of the first node acquired by the user terminal; and
   establishing, according to the type information and the status information of the first node and in accordance with a second predetermined rule, a topological connection between the first node and the at least one second node,
   wherein the modeling analysis method further comprises:
   when the position information and/or the type information of the first node is changed by the user terminal, based on changed position information and/or changed type information, by using the electronic map as a background, automatically disconnecting a line among original lines that does not conform to the first predetermined rule, and automatically forming a line between a changed first node and at least one third node in accordance with the first predetermined rule.

2. The modeling analysis method according to claim 1, wherein the modeling analysis method is applied to a server side, and the acquiring position information and type information of a first node acquired by a user terminal comprises:
  receiving the position information and the type information acquired and sent by the user terminal, a way for the user terminal to acquire the position information and the type information of the first node comprising at least one of user inputting, positioning function of the user terminal, and photographing and automatic recognition functions of the user terminal.

3. The modeling analysis method according to claim 1, wherein the modeling analysis method is applied to the user terminal, and the acquiring position information and type information of a first node acquired by a user terminal comprises:
  acquiring the position information and the type information by the user terminal, a way for the user terminal to acquire the position information and the type information of the first node comprising at least one of user inputting, positioning function of the user terminal, and photographing and automatic recognition functions of the user terminal.

4. The modeling analysis method according to claim 1, further comprising:
  displaying the first node on the electronic map according to the position information and the type information of the first node, and establishing, in accordance with the first predetermined rule and on the electronic map, a line connection between the first node and at least one fourth node displayed on the electronic map.

5. The modeling analysis method according to claim 1, further comprising:
  displaying, according to the topological connection and on the electronic map, a direction of a signal or fluid in the device management network.

6. The modeling analysis method according to claim 5, wherein displaying, on the electronic map, the direction of the signal or fluid in the device management network comprises:
  displaying, by a line with an arrow and on the electronic map, the direction of the signal or fluid in the device management network.

7. The modeling analysis method according to claim 6, wherein the device management network is a power grid management network and the direction of the signal or fluid in the device management network is a power supply direction in the power grid management network.

8. The modeling analysis method according to claim 1, further comprising:
  acquiring position information of an additional node, and acquiring type information and status information of the additional node;
  constructing, based on the position information, the type information, and the status information of the additional node, an additional layer model for extending the device management network; and
  automatically displaying, by using the electronic map as a background, the type information and the status information of the additional node at a corresponding position.

9. The modeling analysis method according to claim 1, wherein the device management network is a power grid management network, the first node is a power grid device, and the modeling analysis method is applied to a power outage management system for users, the method further comprises:
  receiving a user's inquiry sent by the user terminal;
  marking a position of the user on the electronic map;
  determining at least one power grid device associated with the user according to the position; and
  analyzing power outage situation according to the at least one power grid device, and notifying the user of the power outage situation.

10. The modeling analysis method according to claim 1, wherein the device management network is a power grid management network, the first node is a switching device, and the establishing, according to the type information and the status information of the first node and in accordance with a second predetermined rule, a topological connection between the first node and the at least one second node comprises:
  establishing, according to operating status of the switching device and in accordance with the second predetermined rule, the topological connection between the switching device and the at least one second node.

11. An electronic device, comprising:
a processor; and
a memory configured to store instructions executable by the processor,
wherein, the processor is configured to execute the method according to claim 1.

* * * * *